(12) United States Patent
Xu et al.

(10) Patent No.: US 9,059,125 B2
(45) Date of Patent: *Jun. 16, 2015

(54) BATTERY HEATING CIRCUITS AND METHODS WITH RESONANCE COMPONENTS IN SERIES USING VOLTAGE INVERSION

(75) Inventors: Wenhui Xu, Shenzhen (CN); Yaochuan Han, Shenzhen (CN); Wei Feng, Shenzhen (CN); Qinyao Yang, Shenzhen (CN); Wenjin Xia, Shenzhen (CN); Shibin Ma, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 345 days.

This patent is subject to a terminal disclaimer.

(21) Appl. No.: 13/168,004

(22) Filed: Jun. 24, 2011

(65) Prior Publication Data

US 2012/0025776 A1 Feb. 2, 2012

(30) Foreign Application Priority Data

Jul. 30, 2010 (CN) .......................... 2010 1 0245288
Aug. 30, 2010 (CN) .......................... 2010 1 0274785
Dec. 23, 2010 (CN) .......................... 2010 1 0603717

(51) Int. Cl.
*H01M 10/46* (2006.01)
*H02J 7/00* (2006.01)
(Continued)

(52) U.S. Cl.
CPC ......... *H01L 23/345* (2013.01); *H01M 10/5006* (2013.01); *H01M 10/5016* (2013.01);
(Continued)

(58) Field of Classification Search
CPC ................................................... H01M 10/5026

USPC .................................................. 320/167, 128
See application file for complete search history.

(56) References Cited

U.S. PATENT DOCUMENTS 3,654,426 A  4/1972  Brinkmann et al.
3,808,481 A  4/1974  Rippel
(Continued)

FOREIGN PATENT DOCUMENTS

CN  1630129 A  6/2005
CN  1630130 A  6/2005
(Continued)

OTHER PUBLICATIONS

European Patent Office, Extended European Search Report dated Sep. 13, 2011, in related application EP 11166955.2.
(Continued)

*Primary Examiner* — Samuel Berhanu
*Assistant Examiner* — Jerry D Robbins
(74) *Attorney, Agent, or Firm* — Jones Day

(57) ABSTRACT

Circuit and method for heating a battery. The circuit includes the battery including a first damping component and a first current storage component, a switch unit, a switching control component, a first charge storage component, and an energy superposition unit. The switching control component is configured to turn on the switch unit so as to allow a current to flow between the battery and the first charge storage component and to turn off the switch unit so as to stop the current. The energy superposition unit is configured to, after the switch unit is turned on and then turned off, adjust a storage voltage associated with the first charge storage component so that a positive voltage terminal of the first charge storage component is coupled, directly or indirectly, to a negative voltage terminal of the battery.

25 Claims, 12 Drawing Sheets

(51) Int. Cl.
*H01L 23/34* (2006.01)
*H01M 10/615* (2014.01)
*H01M 10/625* (2014.01)
*H01M 10/657* (2014.01)
*H01M 10/6571* (2014.01)
*H02M 3/158* (2006.01)

(52) U.S. Cl.
CPC ...... *H01M10/5081* (2013.01); *H01M 10/5083* (2013.01); *H02J 7/0014* (2013.01); *H02M 3/158* (2013.01); *Y02T 10/7055* (2013.01); *H02J 7/0054* (2013.01); *H02J 7/0075* (2013.01); *H02J 7/0091* (2013.01); *H02J 7/0093* (2013.01); *Y02E 60/12* (2013.01); *H01L 2924/0002* (2013.01)

(56) References Cited

U.S. PATENT DOCUMENTS

| | | | |
|---|---|---|---|
| 4,171,508 A | 10/1979 | Sinclair | |
| 4,184,197 A * | 1/1980 | Cuk et al. | 363/16 |
| 4,222,000 A | 9/1980 | Silvertown et al. | |
| 5,362,942 A | 11/1994 | Vanderslice, Jr. et al. | |
| 5,396,165 A * | 3/1995 | Hwang et al. | 323/210 |
| 5,461,556 A | 10/1995 | Horie et al. | |
| 5,523,671 A | 6/1996 | Stewart | |
| 5,561,597 A | 10/1996 | Limpaecher | |
| 5,768,114 A | 6/1998 | Gruning et al. | |
| 5,789,905 A * | 8/1998 | Yamasaki | 323/222 |
| 5,808,469 A | 9/1998 | Kopera | |
| 5,905,371 A | 5/1999 | Limpaecher | |
| 5,943,224 A | 8/1999 | Mao | |
| 5,948,298 A | 9/1999 | Ijaz | |
| 5,990,661 A | 11/1999 | Ashtiani et al. | |
| 6,002,240 A | 12/1999 | McMahan et al. | |
| 6,072,301 A * | 6/2000 | Ashtiani et al. | 320/128 |
| 6,078,163 A | 6/2000 | Horie et al. | |
| 6,142,130 A | 11/2000 | Ward | |
| 6,211,652 B1 | 4/2001 | Glasgow | |
| 6,259,229 B1 * | 7/2001 | Ashtiani et al. | 320/128 |
| 6,340,879 B1 | 1/2002 | Bläcker | |
| 6,771,518 B2 * | 8/2004 | Orr et al. | 363/16 |
| 6,882,061 B1 | 4/2005 | Ashtiani et al. | |
| 7,292,010 B2 | 11/2007 | Hsu et al. | |
| 7,382,102 B2 | 6/2008 | Ashtiani | |
| 7,402,982 B2 | 7/2008 | Ito et al. | |
| 7,876,583 B2 * | 1/2011 | Polivka et al. | 363/21.14 |
| 8,004,866 B2 * | 8/2011 | Bucella et al. | 363/50 |
| 8,197,502 B2 | 6/2012 | Smith et al. | |
| 8,493,036 B2 | 7/2013 | Ferrario | |
| 2005/0077879 A1 | 4/2005 | Near | |
| 2005/0156578 A1 | 7/2005 | Karmenoff | |
| 2005/0168195 A1 | 8/2005 | MacDougall | |
| 2005/0264237 A1 * | 12/2005 | Ishizuka | 315/209 R |
| 2007/0024243 A1 | 2/2007 | Liu et al. | |
| 2007/0091023 A1 | 4/2007 | Kosaka et al. | |
| 2007/0121258 A1 | 5/2007 | Hachiya | |
| 2009/0014436 A1 | 1/2009 | Toya et al. | |
| 2009/0243547 A1 | 10/2009 | Andelfinger | |
| 2011/0095711 A1 * | 4/2011 | Hsieh et al. | 318/116 |
| 2011/0144861 A1 | 6/2011 | Lakirovich et al. | |
| 2011/0273136 A1 | 11/2011 | Yoshimoto | |
| 2012/0024838 A1 | 2/2012 | Xu et al. | |
| 2012/0025754 A1 | 2/2012 | Xu et al. | |
| 2012/0025755 A1 | 2/2012 | Xu et al. | |
| 2012/0025756 A1 | 2/2012 | Xu et al. | |
| 2012/0025772 A1 | 2/2012 | Xu et al. | |
| 2012/0025774 A1 | 2/2012 | Xu et al. | |
| 2012/0025775 A1 | 2/2012 | Xu et al. | |
| 2012/0025777 A1 | 2/2012 | Xu et al. | |
| 2012/0025778 A1 | 2/2012 | Xu et al. | |
| 2012/0025779 A1 | 2/2012 | Xu et al. | |
| 2012/0025780 A1 | 2/2012 | Xu et al. | |
| 2012/0025781 A1 | 2/2012 | Xu et al. | |
| 2012/0025782 A1 | 2/2012 | Xu et al. | |
| 2012/0025783 A1 | 2/2012 | Xu et al. | |
| 2012/0031890 A1 | 2/2012 | Han et al. | |
| 2012/0032642 A1 | 2/2012 | Xu et al. | |
| 2012/0126753 A1 * | 5/2012 | Carkner | 320/129 |
| 2012/0161711 A1 | 6/2012 | Xu et al. | |
| 2012/0279951 A1 | 11/2012 | Xu et al. | |
| 2012/0280658 A1 | 11/2012 | Xu et al. | |
| 2012/0280659 A1 | 11/2012 | Xu et al. | |
| 2012/0299551 A1 | 11/2012 | Xu et al. | |
| 2012/0306432 A1 | 12/2012 | Xu et al. | |
| 2013/0127398 A1 | 5/2013 | Xu et al. | |
| 2013/0134146 A1 | 5/2013 | Han et al. | |
| 2013/0134945 A1 | 5/2013 | Xu et al. | |
| 2013/0141032 A1 | 6/2013 | Xu et al. | |

FOREIGN PATENT DOCUMENTS

| | | |
|---|---|---|
| CN | 1809942 A | 7/2006 |
| CN | 1836356 A | 9/2006 |
| CN | 1291518 C | 12/2006 |
| CN | 101552479 A | 10/2009 |
| CN | 201397868 Y | 2/2010 |
| CN | 101685971 A | 3/2010 |
| CN | 201435426 Y | 3/2010 |
| CN | 201667552 U | 12/2010 |
| CN | 102055042 A | 5/2011 |
| CN | 102074756 A | 5/2011 |
| CN | 201936966 U | 8/2011 |
| CN | 201936967 U | 8/2011 |
| CN | 201936969 U | 8/2011 |
| CN | 201966300 U | 9/2011 |
| CN | 202009059 U | 10/2011 |
| CN | 202042567 U | 11/2011 |
| CN | 202076380 U | 12/2011 |
| CN | 202103139 U | 1/2012 |
| CN | 202121024 U | 1/2012 |
| CN | 102074755 B | 5/2012 |
| CN | 102074758 B | 6/2012 |
| CN | 102074759 B | 6/2012 |
| CN | 102074753 B | 7/2012 |
| CN | 102074756 B | 7/2012 |
| CN | 102074760 B | 7/2012 |
| CN | 102074762 B | 7/2012 |
| CN | 102074761 B | 9/2012 |
| CN | 102088117 B | 9/2012 |
| CN | 102082306 B | 11/2012 |
| CN | 102088116 B | 11/2012 |
| EP | 0 418 919 A2 | 3/1991 |
| EP | 1 930 922 A2 | 6/2008 |
| JP | 4-12472 A | 1/1992 |
| JP | 5022876 A | 1/1993 |
| JP | 2007-166779 A | 6/2007 |
| JP | 4016045 B2 | 12/2007 |
| SU | 813544 B | 3/1981 |
| TW | 220014 B | 2/1994 |
| TW | 269727 B | 2/1996 |
| TW | 344721 B | 11/1998 |
| TW | 200518370 A | 6/2005 |
| TW | 200527793 A | 8/2005 |
| TW | M275625 U | 9/2005 |
| WO | WO 2010/145439 A1 | 12/2010 |

OTHER PUBLICATIONS

European Patent Office, Extended European Search Report dated Nov. 30, 2011, in related application EP 11166938.8.

European Patent Office, Extended European Search Report dated Dec. 15, 2011, in related application EP 11166941.2.

European Patent Office, Extended European Search Report dated Sep. 16, 2011, in related application EP 11166949.5.

European Patent Office, Extended European Search Report dated Oct. 6, 2011, in related application EP 11166925.5.

European Patent Office, European Search Report dated Sep. 29, 2011, in related application EP 11166958.6.

European Patent Office, Extended European Search Report dated Jan. 25, 2012, in related application EP 11166952.9.

(56) References Cited

OTHER PUBLICATIONS

European Patent Office, European Search Report dated Sep. 21, 2011, in related application EP 11166969.3.
European Patent Office, European Search Report dated Sep. 1, 2011, in related application EP 11166903.2.
European Patent Office, Extended European Search Report dated Nov. 8, 2011, in related application EP 11166872.9.
European Patent Office, Extended European Search Report dated Nov. 25, 2011, in related application EP 11166882.8.
European Patent Office, Extended European Search Report dated Nov. 25, 2011, in related application EP 11166897.6.
European Patent Office, Extended European Search Report dated Sep. 6, 2011, in related application EP 11166900.8.
European Patent Office, Extended European Search Report dated Sep. 23, 2011, in related application EP 11166914.9.
European Patent Office, Extended European Search Report dated Nov. 8, 2011, in related application EP 11166920.6.
European Patent Office, Extended European Search Report dated Sep. 27, 2011, in related application EP 11167066.7.
European Patent Office, Extended European Search Report dated Sep. 8, 2011, in related application EP 11166902.4.
European Patent Office, Extended European Search Report dated Oct. 6, 2011, in related application EP 11167128.5.
Patent Cooperation Treaty, International Search Report and Written Opinion, dated Sep. 1, 2011, in related application PCT/CN2011/074449.
Patent Cooperation Treaty, International Search Report and Written Opinion, dated Aug. 18, 2011, in related application PCT/CN2011/074453.
Patent Cooperation Treaty, International Search Report and Written Opinion, dated Aug. 11, 2011, in related application PCT/CN2011/074463.
Patent Cooperation Treaty, International Search Report and Written Opinion, dated Aug. 25, 2011, in related application PCT/CN2011/074458.
Patent Cooperation Treaty, International Search Report and Written Opinion, dated Aug. 11, 2011, in related application PCT/CN2011/074462.
Patent Cooperation Treaty, International Search Report and Written Opinion, dated Aug. 11, 2011, in related application PCT/CN2011/074457.
Patent Cooperation Treaty, International Search Report and Written Opinion, dated Aug. 25, 2011, in related application PCT/CN2011/074459.
Patent Cooperation Treaty, International Search Report and Written Opinion, dated Aug. 18, 2011, in related application PCT/CN2011/074456.
Patent Cooperation Treaty, International Search Report and Written Opinion, dated Aug. 18, 2011, in related application PCT/CN2011/074460.
Patent Cooperation Treaty, International Search Report and Written Opinion, dated Aug. 11, 2011, in related application PCT/CN2011/074433.
Patent Cooperation Treaty, International Search Report and Written Opinion, dated Aug. 18, 2011, in related application PCT/CN2011/074436.
Patent Cooperation Treaty, International Search Report and Written Opinion, dated Aug. 25, 2011, in related application PCT/CN2011/074438.
Patent Cooperation Treaty, International Search Report and Written Opinion, dated Aug. 11, 2011, in related application PCT/CN2011/074440.
Patent Cooperation Treaty, International Search Report and Written Opinion, dated Aug. 25, 2011, in related application PCT/CN2011/074455.
Patent Cooperation Treaty, International Search Report and Written Opinion, dated Aug. 11, 2011, in related application PCT/CN2011/074461.
Patent Cooperation Treaty, International Search Report and Written Opinion, dated Sep. 1, 2011, in related application PCT/CN2011/074531.
Patent Cooperation Treaty, International Search Report and Written Opinion, dated Aug. 18, 2011, in related application PCT/CN2011/074442.
Patent Cooperation Treaty, International Search Report and Written Opinion, dated Jul. 21, 2011, in related application PCT/CN2011/074536.
United States Patent and Trademark Office, Office Action mailed Jul. 16, 2013, in related U.S. Appl. No. 13/166,281.
United States Patent and Trademark Office, Office Action mailed May 22, 2013, in related U.S. Appl. No. 13/168,014.
United States Patent and Trademark Office, Office Action mailed Jul. 5, 2013, in related U.S. Appl. No. 13/170,021.
United States Patent and Trademark Office, Office Action mailed Jul. 30, 2013, in related U.S. Appl. No. 13/166,301.
United States Patent and Trademark Office, Office Action mailed Sep. 5, 2013, in related U.S. Appl. No. 13/189,096.
United States Patent and Trademark Office, Office Action mailed Aug. 29, 2013, in related U.S. Appl. No. 13/187,874.
United States Patent and Trademark Office, Office Action mailed Aug. 29, 2013, in related U.S. Appl. No. 13/189,114.
United States Patent and Trademark Office, Office Action mailed Sep. 30, 2013, in related U.S. Appl. No. 13/170,044.
United States Patent and Trademark Office, Office Action mailed Jun. 19, 2013, in related U.S. Appl. No. 13/187,890.
Taiwan Intellectual Property Office, Office Action dated Jan. 10, 2014, in related application TW 100143128.
Taiwan Intellectual Property Office, Office Action dated Jan. 10, 2014, in related application TW 100143130.
Taiwan Intellectual Property Office, Office Action dated Jan. 10, 2014, in related application TW 100143133.
Taiwan Intellectual Property Office, Office Action dated Jan. 7, 2014, in related application TW 100140587.
Taiwan Intellectual Property Office, Office Action dated Jan. 6, 2014, in related application TW 100140588.
Taiwan Intellectual Property Office, Office Action dated Feb. 17, 2014, in related application TW 100143160.
Taiwan Intellectual Property Office, Office Action dated Jan. 6, 2014, in related application TW 100140590.
Taiwan Intellectual Property Office, Office Action dated Jan. 17, 2014, in related application TW 100141797.
Taiwan Intellectual Property Office, Office Action dated Jan. 17, 2014, in related application TW 100141802.
United States Patent and Trademark Office, Notice of Allowance mailed Dec. 5, 2013, in related U.S. Appl. No. 13/166,281.
United States Patent and Trademark Office, Notice of Allowance mailed Nov. 8, 2013, in related U.S. Appl. No. 13/166,301.
United States Patent and Trademark Office, Notice of Allowance mailed Jan. 6, 2014, in related U.S. Appl. No. 13/189,096.
United States Patent and Trademark Office, Notice of Allowance mailed Jan. 6, 2014, in related U.S. Appl. No. 13/187,874.
United States Patent and Trademark Office, Office Action mailed Nov. 22, 2013, in related U.S. Appl. No. 13/168,014.
United States Patent and Trademark Office, Final Office Action mailed Feb. 25, 2014, in related U.S. Appl. No. 13/170,021.
United States Patent and Trademark Office, Office Action mailed Jan. 6, 2014, in related U.S. Appl. No. 13/187,266.
United States Patent and Trademark Office, Office Action mailed Jan. 3, 2014, in related U.S. Appl. No. 13/184,906.
United States Patent and Trademark Office, Office Action mailed Jan. 2, 2014, in related U.S. Appl. No. 13/189,114.
United States Patent and Trademark Office, Office Action mailed Dec. 3, 2013, in related U.S. Appl. No. 13/187,279.
United States Patent and Trademark Office, Office Action mailed Dec. 4, 2013, in related U.S. Appl. No. 13/187,890.
United States Patent and Trademark Office, Office Action mailed Jan. 6, 2014, in related U.S. Appl. No. 13/541,487.
United States Patent and Trademark Office, Office Action mailed Dec. 4, 2013, in related U.S. Appl. No. 13/748,525.
United States Patent and Trademark Office, Office Action mailed Jan. 15, 2014, in related U.S. Appl. No. 13/749,480.

(56) References Cited

OTHER PUBLICATIONS

United States Patent and Trademark Office, Office Action mailed Jun. 18, 2014, in related U.S. Appl. No. 13/168,014.
United States Patent and Trademark Office, Office Action mailed Jun. 16, 2014, in related U.S. Appl. No. 13/184,879.
United States Patent and Trademark Office, Office Action mailed Jun. 20, 2014, in related U.S. Appl. No. 13/184,894.
United States Patent and Trademark Office, Office Action mailed Jun. 25, 2014, in related U.S. Appl. No. 13/187,266.
United States Patent and Trademark Office, Office Action mailed Jun. 24, 2014, in related U.S. Appl. No. 13/184,906.
United States Patent and Trademark Office, Office Action mailed Jun. 17, 2014, in related U.S. Appl. No. 13/185,744.
United States Patent and Trademark Office, Office Action mailed Jun. 16, 2014, in related U.S. Appl. No. 13/184,915.
United States Patent and Trademark Office, Office Action mailed Jun. 24, 2014, in related U.S. Appl. No. 13/187,279.
United States Patent and Trademark Office, Office Action mailed Jun. 13, 2014, in related U.S. Appl. No. 13/185,756.
United States Patent and Trademark Office, Office Action mailed Jul. 7, 2014, in related U.S. Appl. No. 13/187,890.
United States Patent and Trademark Office, Office Action mailed Jun. 25, 2014, in related U.S. Appl. No. 13/541,487.
United States Patent and Trademark Office, Office Action mailed Jun. 26, 2014, in related U.S. Appl. No. 13/748,525.
United States Patent and Trademark Office, Office Action mailed Jun. 24, 2014, in related U.S. Appl. No. 13/749,480.
United States Patent and Trademark Office, Notice of Allowance mailed Apr. 25, 2014, in related U.S. Appl. No. 13/166,281.
United States Patent and Trademark Office, Notice of Allowance mailed Jun. 24, 2014, in related U.S. Appl. No. 13/170,021.
United States Patent and Trademark Office, Notice of Allowance mailed May 2, 2014, in related U.S. Appl. No. 13/166,301.
United States Patent and Trademark Office, Notice of Allowance mailed Jun. 18, 2014, in related U.S. Appl. No. 13/189,096.
United States Patent and Trademark Office, Notice of Allowance mailed May 8, 2014, in related U.S. Appl. No. 13/187,874.
United States Patent and Trademark Office, Notice of Allowance mailed Apr. 28, 2014, in related U.S. Appl. No. 13/189,114.
United States Patent and Trademark Office, Notice of Allowance mailed May 22, 2014, in related U.S. Appl. No. 13/170,044.
United States Patent and Trademark Office, Office Action mailed Sep. 26, 2014, in related U.S. Appl. No. 13/544,881.
United States Patent and Trademark Office, Office Action mailed Sep. 3, 2014, in related U.S. Appl. No. 13/486,883.
United States Patent and Trademark Office, Office Action mailed Sep. 11, 2014, in related U.S. Appl. No. 13/465,906.
United States Patent and Trademark Office, Office Action mailed Sep. 11, 2014, in related U.S. Appl. No. 13/545,885.
United States Patent and Trademark Office, Notice of Allowance mailed Oct. 6, 2014, in related U.S. Appl. No. 13/168,014.
United States Patent and Trademark Office, Notice of Allowance mailed Oct. 6, 2014, in related U.S. Appl. No. 13/184,906.
United States Patent and Trademark Office, Notice of Allowance mailed Oct. 6, 2014, in related U.S. Appl. No. 13/187,279.
United States Patent and Trademark Office, Notice of Allowance mailed Oct. 3, 2014, in related U.S. Appl. No. 13/187,890.
United States Patent and Trademark Office, Notice of Allowance mailed Oct. 7, 2014, in related U.S. Appl. No. 13/541,487.
United States Patent and Trademark Office, Notice of Allowance mailed Oct. 6, 2014, in related U.S. Appl. No. 13/748,525.
United States Patent and Trademark Office, Notice of Allowance mailed Oct. 6, 2014, in related U.S. Appl. No. 13/749,480.
United States Patent and Trademark Office, Office Action mailed Nov. 17, 2014, in related U.S. Appl. No. 13/187,266.
United States Patent and Trademark Office, Office Action mailed Dec. 11, 2014, in related U.S. Appl. No. 13/184,879.
United States Patent and Trademark Office, Office Action mailed Dec. 24, 2014, in related U.S. Appl. No. 13/184,894.
United States Patent and Trademark Office, Office Action mailed Dec. 31, 2014, in related U.S. Appl. No. 13/185,744.
United States Patent and Trademark Office, Office Action mailed Jan. 13, 2015, in related U.S. Appl. No. 13/184,915.
United States Patent and Trademark Office, Office Action mailed Dec. 31, 2014, in related U.S. Appl. No. 13/185,756.
United States Patent and Trademark Office, Office Action mailed Mar. 25, 2015, in related U.S. Appl. No. 13/187,266.
United States Patent and Trademark Office, Office Action mailed Apr. 1, 2015, in related U.S. Appl. No. 13/747,387.
United States Patent and Trademark Office, Office Action mailed Feb. 13, 2015, in related U.S. Appl. No. 13/465,906.
United States Patent and Trademark Office, Office Action mailed Apr. 13, 2015, in related U.S. Appl. No. 13/545,885.
United States Patent and Trademark Office, Notice of Allowance mailed Mar. 18, 2015, in related U.S. Appl. No. 13/184,879.
United States Patent and Trademark Office, Notice of Allowance mailed Mar. 27, 2015, in related U.S. Appl. No. 13/184,894.
United States Patent and Trademark Office, Notice of Allowance mailed Mar. 23, 2015, in related U.S. Appl. No. 13/185,744.
United States Patent and Trademark Office, Notice of Allowance mailed Mar. 30, 2015, in related U.S. Appl. No. 13/184,915.
United States Patent and Trademark Office, Corrected Notice of Allowability mailed Feb. 11, 2015, in related U.S. Appl. No. 13/187,279.
United States Patent and Trademark Office, Notice of Allowance mailed Apr. 29, 2015, in related U.S. Appl. No. 13/185,756.
United States Patent and Trademark Office, Notice of Allowance mailed Mar. 3, 2015, in related U.S. Appl. No. 13/544,881.
United States Patent and Trademark Office, Supplemental Notice of Allowability mailed Mar. 17, 2015, in related U.S. Appl. No. 13/544,881.
United States Patent and Trademark Office, Notice of Allowance mailed Mar. 27, 2015, in related U.S. Appl. No. 13/747,378.
United States Patent and Trademark Office, Notice of Allowance mailed Mar. 18, 2015, in related U.S. Appl. No. 13/486,883.
United States Patent and Trademark Office, Corrected Notice of Allowability mailed Feb. 23, 2015, in related U.S. Appl. No. 13/748,525.

* cited by examiner

BATTERY HEATING CIRCUITS AND METHODS WITH RESONANCE COMPONENTS IN SERIES USING VOLTAGE INVERSION

1. CROSS-REFERENCE TO RELATED APPLICATIONS

This application claims priority to Chinese Patent Application No. 201010245288.0, filed Jul. 30, 2010, Chinese Patent Application No. 201010274785.3, filed Aug. 30, 2010, and Chinese Patent Application No. 201010603717.7, filed Dec. 23, 2010, all these three applications being incorporated by reference herein for all purposes.

Additionally, this application is related to International Application Publication No. WO2010/145439A1 and Chinese Application Publication No. CN102055042A, both these two applications being incorporated by reference herein for all purposes.

2. BACKGROUND OF THE INVENTION

The present invention pertains to electric and electronic field, in particular related to a battery heating circuit.

Considering cars need to run under complex road conditions and environmental conditions or some electronic devices are used under harsh environmental conditions, the battery, which serves as the power supply unit for electric-motor cars or electronic devices, need to be adaptive to these complex conditions. In addition, besides these conditions, the service life and charge/discharge cycle performance of the battery need to be taken into consideration; especially, when electric-motor cars or electronic devices are used in low temperature environments, the battery needs to have outstanding low-temperature charge/discharge performance and higher input/output power performance.

Usually, under low temperature conditions, the resistance of the battery will increase, and so will the polarization; therefore, the capacity of the battery will be reduced.

To keep the capacity of the battery and improve the charge/discharge performance of the battery under low temperature conditions, some embodiments of the present invention provide a battery heating circuit.

3. BRIEF SUMMARY OF THE INVENTION

The objective of certain embodiments of the present invention is to provide a battery heating circuit, in order to solve the problem of decreased capacity of the battery caused by increased resistance and polarization of the battery under low temperature conditions.

One embodiment of the present invention provides a battery heating circuit, comprising a switch unit, a switching control module, a damping component R1, an energy storage circuit, and an energy superposition unit, wherein: the energy storage circuit is connected with the battery and comprises a current storage component L1 and a charge storage component C1; the damping component R1, the switch unit, the current storage component L1, and the charge storage component C1 are connected in series; the switching control module is connected with the switch unit, and configured to control ON/OFF of the switch unit, so as to control the energy flowing between the battery and the energy storage circuit; the energy superposition unit is connected with the energy storage circuit, and is configured to superpose the energy in the energy storage circuit with the energy in the battery after the switch unit switches on and then switches off.

According to some embodiments, the heating circuit provided in the present invention can improve the charge/discharge performance of a battery. In addition, for example, since an energy storage circuit is connected with the battery in series in the heating circuit, the safety problem related to short circuit caused by failure of the switch unit can be avoided when the battery is heated due to the existence of the charge storage component connected in series, and therefore the battery can be protected effectively. Moreover, an energy superposition unit is provided in the heating circuit in one embodiment of the present invention, and the energy superposition unit can, for example, superpose the energy in the energy storage circuit with the energy in the battery after the switch unit switches on and then switches off; thus, the discharging current in the heating loop will be increased when the switch unit is controlled to switch on at the next time, and therefore the working efficiency of the heating circuit is improved.

Other characteristics and advantages of the present invention will be further described in detail in the following section for embodiments.

4. BRIEF DESCRIPTION OF THE DRAWINGS

The accompanying drawings, as a part of this description, are provided here to facilitate further understanding of the present invention, and are used in conjunction with the following embodiments to explain the present invention, but shall not be comprehended as constituting any limitation on the present invention. In the figures.

5. DETAILED DESCRIPTION OF THE INVENTION

Figure 1:
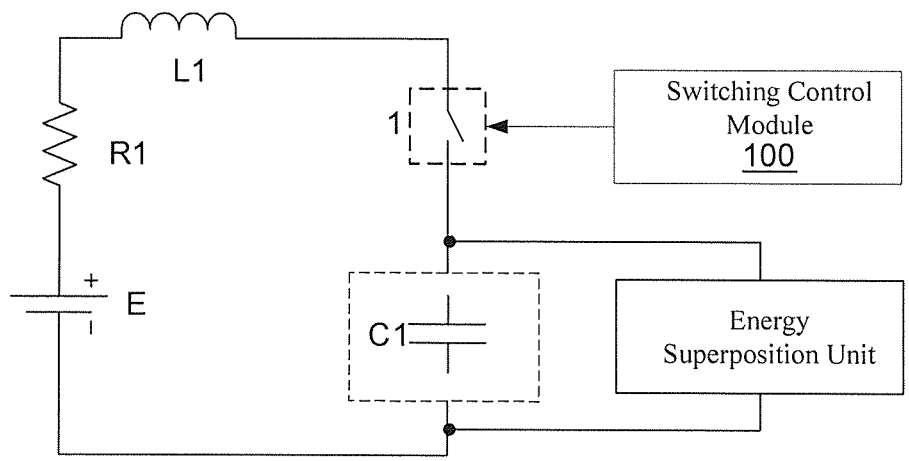
FIG. 1 is a schematic diagram showing a battery heating circuit according to one embodiment of the present invention.

Certain embodiments of the present invention are described in detail below, with reference to the accompanying drawings. It should be appreciated that the embodiments described here are only provided to describe and explain the present invention, but shall not be deemed as constituting any limitation on the present invention.

It is noted that, unless otherwise specified, when mentioned hereafter in this description, the term "switching control module" may refer to any controller that can output control commands (e.g., pulse waveforms) under preset conditions or at preset times and thereby control the switch unit connected to it to switch on or switch off accordingly, according to some embodiments. For example, the switching control module can be a PLC. Unless otherwise specified, when mentioned hereafter in this description, the term "switch" may refer to a switch that enables ON/OFF control by using electrical signals or enables ON/OFF control on the basis of the characteristics of the component according to certain embodiments. For example, the switch can be either a one-way switch (e.g., a switch composed of a two-way switch and a diode connected in series, which can be conductive in one direction) or a two-way switch (e.g., a Metal Oxide Semiconductor Field Effect Transistor (MOSFET) or an IGBT with an anti-parallel freewheeling diode). Unless otherwise specified, when mentioned hereafter in this description, the term "two-way switch" may refer to a switch that can be conductive in two directions, which can enable ON/OFF control by using electrical signals or enable ON/OFF control on the basis of the characteristics of the component according to some embodiments. For example, the two-way switch can be a MOSFET or an IGBT with an anti-parallel freewheeling diode. Unless otherwise specified, when mentioned hereafter in this description, the term "one-way semiconductor component" may refer to a semiconductor component that can be conductive in one direction, such as a diode, according to certain embodiments. Unless otherwise specified, when mentioned hereafter in this description, the term "charge storage component" may refer to any device that can enable charge storage, such as a capacitor, according to some embodiments. Unless otherwise specified, when mentioned hereafter in this description, the term "current storage component" may refer to any device that can store current, such as an inductor, according to certain embodiments. Unless otherwise specified, when mentioned hereafter in this description, the term "forward direction" may refer to the direction in which the energy flows from the battery to the energy storage circuit, and the term "reverse direction" may refer to the direction in which the energy flows from the energy storage circuit to the battery, according to some embodiments. Unless otherwise specified, when mentioned hereafter in this description, the term "battery" may comprise primary battery (e.g., dry battery or alkaline battery, etc.) and secondary battery (e.g., lithium-ion battery, nickel-cadmium battery, nickel-hydrogen battery, or lead-acid battery, etc.), according to certain embodiments. Unless otherwise specified, when mentioned hereafter in this description, the term "damping component" may refer to any device that inhibits current flow and thereby enables energy consumption, such as a resistor, etc., according to some embodiments. Unless otherwise specified, when mentioned hereafter in this description, the term "main loop" may refer to a loop composed of battery, damping component, switch unit and energy storage circuit connected in series according to certain embodiments.

It should be noted specially that, considering different types of batteries have different characteristics, in some embodiments of the present invention, "battery" may refer to an ideal battery that does not have internal parasitic resistance and parasitic inductance or has very low internal parasitic resistance and parasitic inductance, or may refer to a battery pack that has internal parasitic resistance and parasitic inductance; therefore, those skilled in the art should appreciate that if the battery is an ideal battery that does not have internal parasitic resistance and parasitic inductance or has very low internal parasitic resistance and parasitic inductance, the damping component R1 may refer to a damping component external to the battery and the current storage component L1 may refer to a current storage component external to the battery; if the battery is a battery pack that has internal parasitic resistance and parasitic inductance, the damping component R1 may refer to a damping component external to the battery or refer to the parasitic resistance in the battery pack, and the current storage component L1 may refer to a current storage component external to the battery or refer to the parasitic inductance in the battery pack, according to certain embodiments.

To ensure the normal service life of the battery, according to some embodiments, the battery can be heated under low temperature condition, which is to say, when the heating condition is met, the heating circuit is controlled to start heating for the battery; when the heating stop condition is met, the heating circuit is controlled to stop heating, according to certain embodiments.

In the actual application of battery, the battery heating condition and heating stop condition can be set according to the actual ambient conditions, to ensure normal charge/discharge performance of the battery, according to some embodiments.

To heat up a battery E in low temperature environment, as shown in FIG. 1, one embodiment of the present invention provides a battery heating circuit, comprising a switch unit 1, a switching control module 100, a damping component R1, an energy storage circuit, and an energy superposition unit, wherein: the energy storage circuit is connected with the battery, and comprises a current storage component L1 and a charge storage component C1; the damping component R1, switch unit 1, current storage component L1, and charge storage component C1 are connected in series; the switching control module 100 is connected with the switch unit 1, and configured to control ON/OFF of the switch unit 1, so as to control the energy flowing between the battery and the energy storage circuit; the energy superposition unit is connected with the energy storage circuit, and is configured to superpose the energy in the energy storage circuit with the energy in the battery after the switch unit 1 switches on and then switches off.

With the technical solution of certain embodiments of the present invention, when the heating condition is met, the switching control module 100 controls the switch unit 1 to switch on, and thus the battery E is connected with the energy storage circuit in series to form a loop, and can discharge through the loop (i.e., charge the charge storage component C1); when the current in the loop reaches zero in forward direction after the peak current, the charge storage component C1 begins to discharge through the loop, i.e., charge the battery E; in the charge/discharge process of the battery E, the current in the loop always passes through the damping component R1, no matter whether the current flows in forward direction or reverse direction, and thus the battery E is heated up by the heat generated in the damping component R1; by controlling the ON/OFF time of the switch unit 1, the battery E can be controlled to heat up only in discharge mode or in both discharge mode and charge mode. When the heating stop condition is met, the switching control module 100 can control the switch unit 1 to switch off and thereby stop the operation of the heating circuit.

The energy superposition unit is connected with the energy storage circuit, and is configured to superpose the energy in the energy storage circuit with the energy in the battery E after the switch unit 1 switches on and then switches off, so that the discharging current in the heating loop will be increased when the switch unit 1 switches on again, and thereby the working efficiency of the heating circuit is improved.

Figure 2:
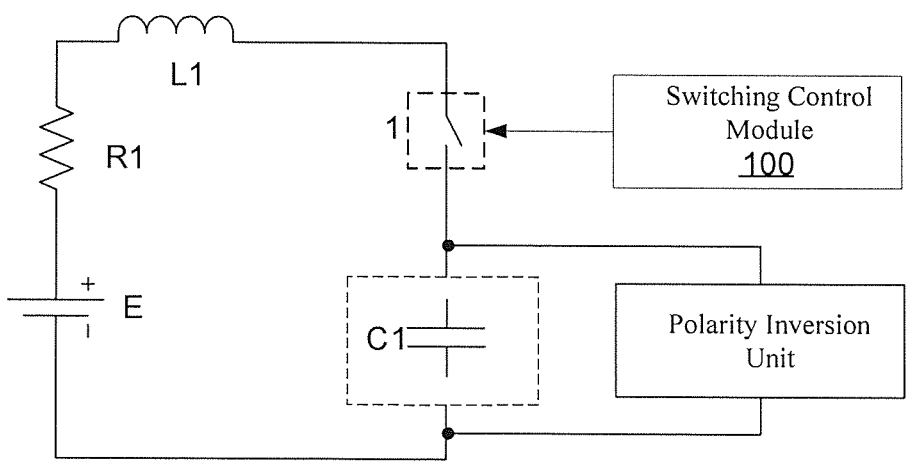
FIG. 2 is a schematic diagram showing the energy superposition unit as part of the battery heating circuit as shown in FIG. 1 according to one embodiment of the present invention.

In one embodiment of the present invention, as shown in FIG. 2, the energy superposition unit comprises a polarity inversion unit 102, which is connected with the energy storage circuit, and is configured to invert the voltage polarity of the charge storage component C1 after the switch unit 1 switches on and then switches off. Since the voltage of the charge storage component C1 can be superposed in series with the voltage of the battery E after polarity inversion, the discharging current in the heating loop will be increased when the switch unit 1 switches on again.

Figure 3:
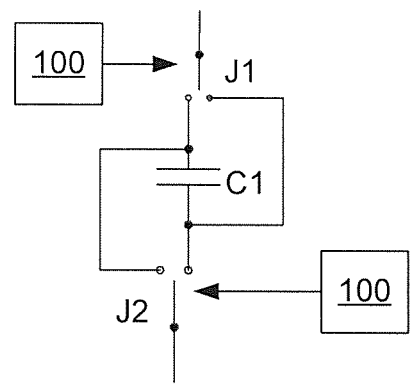
FIG. 3 is a schematic diagram showing the polarity inversion unit for the energy superposition unit as part of the battery heating circuit as shown in FIG. 2 according to one embodiment of the present invention.

As one embodiment of the polarity inversion unit 102, as shown in FIG. 3, the polarity inversion unit 102 comprises a single-pole double-throw switch J1 and a single-pole double-throw switch J2 located on the two ends of the charge storage component C1 respectively; the input wires of the single-pole double-throw switch J1 are connected in the energy storage circuit, the first output wire of the single-pole double-throw switch J1 is connected with the first pole plate of the charge storage component C1, and the second output wire of the single-pole double-throw switch J1 is connected with the second pole plate of the charge storage component C1; the input wires of the single-pole double-throw switch J2 are connected in the energy storage circuit, the first output wire of the single-pole double-throw switch J2 is connected with the second pole plate of the charge storage component C1, and the second output wire of the single-pole double-throw switch J2 is connected with the first pole plate of the charge storage component C1; the switching control module 100 is also connected with the single-pole double-throw switch J1 and single-pole double-throw switch J2 respectively, and is configured to invert the voltage polarity of the charge storage component C1 by altering the connection relationships between the respective input wires and output wires of the single-pole double-throw switch J1 and the single-pole double-throw switch J2.

According to this embodiment, the connection relationships between the respective input wires and output wires of the single-pole double-throw switch J1 and the single-pole double-throw switch J2 can be set in advance, so that the input wire of the single-pole double-throw switch J1 is connected to the first output wire of the single-pole double-throw switch J1 and the input wire of the single-pole double-throw switch J2 is connected to the first output wire of the single-pole double-throw switch J2 when the switch unit 1 switches on; the input wire of the single-pole double-throw switch J1 is switched to connect with the second output wire of the single-pole double-throw switch J1 and the input wire of the single-pole double-throw switch J2 is switched to connect with the second output wire of the single-pole double-throw switch J2 under control of the switching control module 100 when the switch unit 1 switches off, and thereby the voltage polarity of the charge storage component C1 is inverted.

Figure 4:
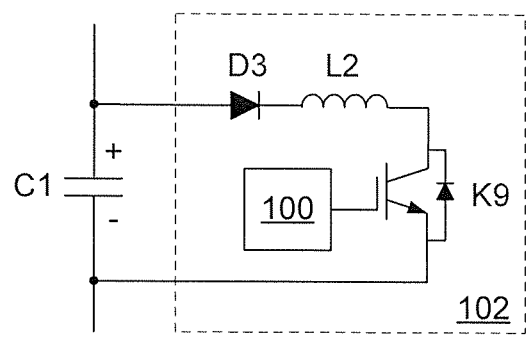
FIG. 4 is a schematic diagram showing the polarity inversion unit for the energy superposition unit as part of the battery heating circuit as shown in FIG. 2 according to another embodiment of the present invention.

As another embodiment of the polarity inversion unit 102, as shown in FIG. 4, the polarity inversion unit 102 comprises a one-way semiconductor component D3, a current storage component L2, and a switch K9; the charge storage component C1, current storage component L2, and switch K9 are connected sequentially in series to form a loop; the one-way semiconductor component D3 is connected in series between the charge storage component C1 and the current storage component L2 or between the current storage component L2 and the switch K9; the switching control module 100 is also connected with the switch K9, and is configured to invert the voltage polarity of the charge storage component C1 by controlling the switch K9 to switch on.

According to the above embodiment, when the switch unit 1 switches off, the switch K9 can be controlled to switch on by the switching control module 100, and thereby the charge storage component C1, one-way semiconductor component D3, current storage component L2, and switch K9 form a LC oscillation loop, and the charge storage component C1 discharges through the current storage component L2, thus, the voltage polarity of the charge storage component C1 will be inverted when the current flowing through the current storage component L2 reaches zero after the current in the oscillation circuit flows through the positive half cycle.

Figure 5:
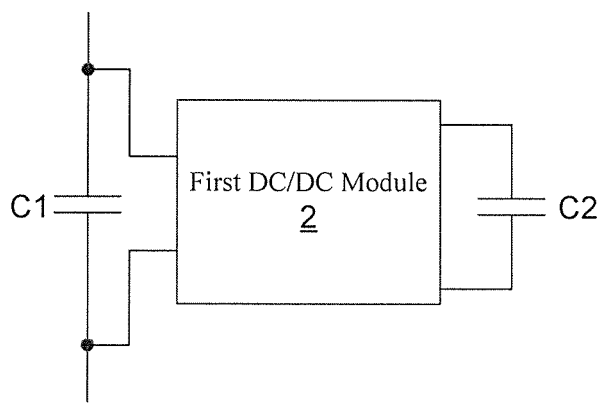
FIG. 5 is a schematic diagram showing the polarity inversion unit for the energy superposition unit as part of the battery heating circuit as shown in FIG. 2 according to yet another embodiment of the present invention.

As yet another embodiment of the polarity inversion unit 102, as shown in FIG. 5, the polarity inversion unit 102 comprises a first DC-DC module 2 and a charge storage component C2; the first DC-DC module 2 is connected with the charge storage component C1 and the charge storage component C2 respectively; the switching control module 100 is also connected with the first DC-DC module 2, and is configured to transfer the energy in the charge storage component C1 to the charge storage component C2 by controlling the operation of the first DC-DC module 2, and then transfer the energy in the charge storage component C2 back to the charge storage component C1, so as to invert the voltage polarity of the charge storage component C1.

The first DC-DC module 2 is a DC-DC (direct current to direct current) conversion circuit for voltage polarity inversion commonly used in the field. The present invention does not impose any limitation to the specific circuit structure of the first DC-DC module 2, as long as the module can accomplish voltage polarity inversion of the charge storage component C1 according to some embodiments. Those skilled in the art can add, substitute, or delete the components in the circuit as needed.

Figure 6:
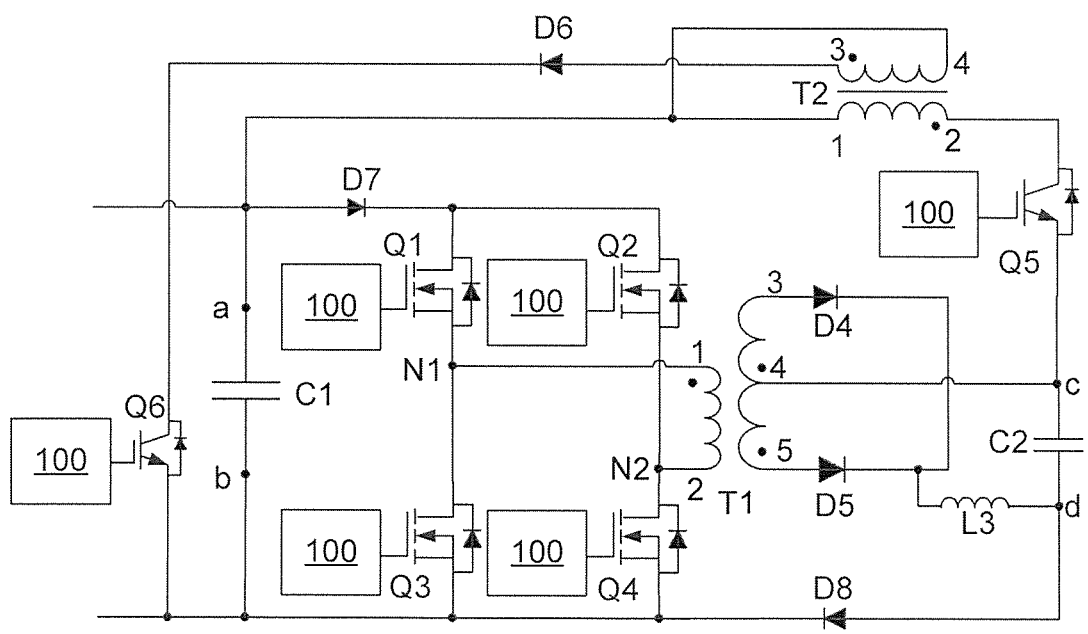
FIG. 6 is a schematic diagram showing the first DC-DC module for the polarity inversion unit as part of the battery heating circuit as shown in FIG. 5 according to one embodiment of the present invention.

FIG. 6 shows one embodiment of the first DC-DC module 2 provided in the present invention. As shown in FIG. 6, the first DC-DC module 2 comprises: a two-way switch Q1, a two-way switch Q2, a two-way switch Q3, a two-way switch Q4, a first transformer T1, a one-way semiconductor component D4, a one-way semiconductor component D5, a current storage component L3, a two-way switch Q5, a two-way switch Q6, a second transformer T2, a one-way semiconductor component D6, a one-way semiconductor component D7, and a one-way semiconductor component D8.

In the embodiment, the two-way switch Q1, two-way switch Q2, two-way switch Q3, and two-way switch Q4 are MOSFETs, and the two-way switch Q5 and two-way switch Q6 are IGBTs.

The Pin 1, 4, and 5 of the first transformer T1 are dotted terminals, and the pin 2 and 3 of the second transformer T2 are dotted terminals.

Wherein: the positive electrode of the one-way semiconductor component D7 is connected with the end 'a' of the charge storage component C1, and the negative electrode of the one-way semiconductor component D7 is connected with the drain electrodes of the two-way switch Q1 and two-way switch Q2, respectively; the source electrode of the two-way switch Q1 is connected with the drain electrode of the two-way switch Q3, and the source electrode of the two-way switch Q2 is connected with the drain electrode of the two-way switch Q4; the source electrodes of the two-way switch Q3 and two-way switch Q4 are connected with the end 'b' of the charge storage component C1 respectively. Thus, a full-bridge circuit is formed, here, the voltage polarity of end 'a' of the charge storage component C1 is positive, while the voltage polarity of end 'b' of the charge storage component C1 is negative.

In the full-bridge circuit, the two-way switch Q1, two-way switch Q2 constitute the upper bridge arm, while the two-way switch Q3 and two-way switch Q4 constitute the lower bridge arm. The full-bridge circuit is connected with the charge storage component C2 via the first transformer T1; the pin 1 of the first transformer T1 is connected with the first node N1, the pin 2 of the first transformer T1 is connected with the second node N2, the pin 3 and pin 5 of the first transformer T1 are connected to the positive electrode of the one-way semiconductor component D4 and the positive electrode of the one-way semiconductor component D5 respectively; the negative electrode of one-way semiconductor component D4 and the negative electrode of one-way semiconductor component D5 are connected with one end of the current storage component L3, and the other end of the current storage component L3 is connected with the end 'd' of the charge storage component C2; the pin 4 of the transformer T1 is connected with the end 'c' of the charge storage component C2, the positive electrode of the one-way semiconductor component D8 is connected with the end 'd' of the charge storage component C2, and the negative electrode of the one-way semiconductor component D8 is connected with the end 'b' of the charge storage component C1; here, the voltage polarity of end 'c' of the charge storage component C2 is negative, while the voltage polarity of end 'd' of the charge storage component C2 is positive.

Wherein: the end 'c' of the charge storage component C2 is connected with the emitter electrode of the two-way switch Q5, the collector electrode of the two-way switch Q5 is connected with the pin 2 of the transformer T2, the pin 1 of the transformer T2 is connected with end 'a' of the charge storage component C1, the pin 4 of the transformer T2 is connected with end 'a' of the charge storage component C1, the pin 3 of the transformer T2 is connected with the positive electrode of the one-way semiconductor component D6, the negative electrode of the one-way semiconductor component D6 is connected with the collector electrode of the two-way switch Q6, and the emitter electrode of the two-way switch Q6 is connected with the end 'b' of the charge storage component C2.

Wherein: the two-way switch Q1, two-way switch Q2, two-way switch Q3, two-way switch Q4, two-way switch Q5, and two-way switch Q6 are controlled by the switching control module 100 respectively to switch on and switch off.

Hereafter the working process of the first DC-DC module 2 will be described:

1. After the switch unit 1 switches off, the switching control module 100 controls the two-way switch Q5 and two-way switch Q6 to switch off, and controls the two-way switch Q1 and two-way switch Q4 to switch on at the same time to form phase A; controls the two-way switch Q2 and two-way switch Q3 to switch on at the same time to form phase B. Thus, by controlling the phase A and phase B to switch on alternately, a full-bridge circuit is formed;

2. When the full-bridge circuit operates, the energy in the charge storage component C1 is transferred through the first transformer T1, one-way semiconductor component D4, one-way semiconductor component D5, and current storage component L3 to the charge storage component C2; now, the voltage polarity of end 'c' of the charge storage component C2 is negative, while the voltage polarity of end 'd' of the charge storage component C2 is positive.

3. The switching control module 100 controls the two-way switch Q5 to switch on, and therefore a path from the charge storage component C1 to the charge storage component C2 is formed via the second transformer T2 and the one-way semiconductor component D8, thus, the energy in the charge storage component C2 is transferred back to the charge storage component C1, wherein: some energy will be stored in the second transformer T2, Now, the switching control module 100 controls the two-way switch Q5 to switch off and controls the two-way switch Q6 to switch on, and therefore the energy stored in the second transformer T2 is transferred to the charge storage component C1 by the second transformer T2 and the one-way semiconductor component D6; now, the voltage polarity of the charge storage component C1 is inverted such that end 'a' is negative and end 'b' is positive. Thus, the purpose of inverting the voltage polarity of the charge storage component C1 is attained.

To prevent the charge storage component C1 from charging the battery E at low temperature and ensure the charge/discharge performance of the battery E, in one embodiment of the heating circuit provided in the present invention, the switching control module 100 is configured to control ON/OFF of the switch unit 1, so as to control the energy to flow from the battery E to the energy storage circuit only, and thus the charging of battery E by the charge storage component C1 is prevented.

Figure 7:
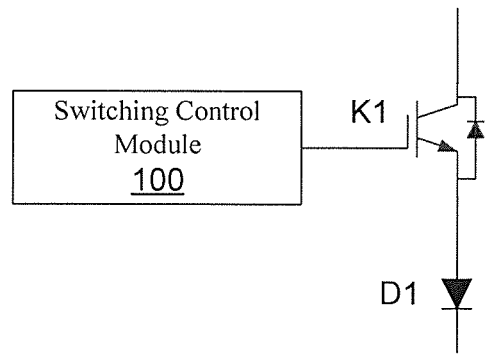
FIG. 7 is a schematic diagram showing the switch unit as part of the battery heating circuit as shown in FIG. 1 according to one embodiment of the present invention.

In order to control the energy to flow from the battery E to the charge storage component C1 only, in one embodiment of the present invention, as shown in FIG. 7, the switch unit 1 comprises a switch K1 and a one-way semiconductor component D1, wherein: the switch K1 and the one-way semiconductor component D1 are connected with each other in series, and then connected in series in the energy storage circuit; the switching control module 100 is connected with the switch K1, and is configured to control ON/OFF of the switch unit 1 by controlling ON/OFF of the switch K1. By connecting a one-way semiconductor component D1 in series in the circuit, energy backflow from the charge storage component C1 can be prevented, and thereby charging of battery E can be avoided in case the switch K1 fails.

As for the embodiment in which the energy flows from the battery E to the charge storage component C1 only, the switching control module 100 is configured to control the switch unit 1 to switch off when or before the current flow through the switch unit 1 reaches zero after the switch unit 1 switches on, as long as the current is controlled to flow from the battery E to the charge storage component C1 only.

Since the current drop rate is very high when the switch K1 switches off, high over-voltage will be induced on the current storage component L1 and may cause damage to the switch K1 because the current and voltage are beyond the safe working range. Therefore, preferably the switching control module 100 is configured to control the switch K1 to switch off when the current flow through the switch unit 1 reaches zero after the switch unit 1 switches on.

Figure 8:
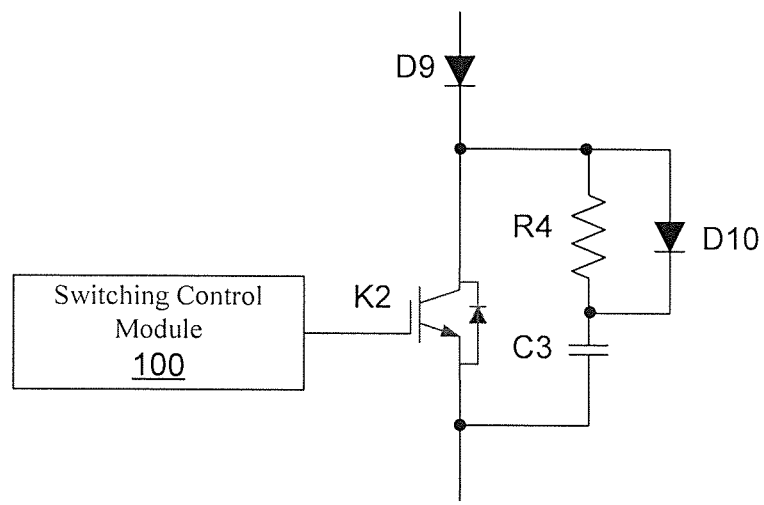
FIG. 8 is a schematic diagram showing the switch unit as part of the battery heating circuit as shown in FIG. 1 according to another embodiment of the present invention.

To improve heating efficiency, preferably, in another embodiment of the present invention, as shown in FIG. 8, the switching control module 100 is configured to control the switch unit 1 to switch off before the current flow through the switch unit 1 reaches zero after the switch unit 1 switches on; the switch unit 1 comprises a one-way semiconductor component D9, a one-way semiconductor component D10, a switch K2, a damping component R4, and a charge storage component C3, wherein: the one-way semiconductor component D9 and the switch K2 are connected in series in the energy storage circuit, the damping component R4 and the charge storage component C3 are connected in series, and then connected in parallel across the switch K2; the one-way semiconductor component D10 is connected in parallel across the damping component R4, and is configured to sustain the current to the current storage component L1 when the switch K2 switches off; the switching control module 100 is connected with the switch K2, and is configured to control ON/OFF of the switch unit 1 by controlling ON/OFF of the switch K2.

The one-way semiconductor component D10, damping component R4, and charge storage component C3 constitute an absorption loop, which is configured to reduce the current drop rate in the energy storage circuit when the switch K2 switches off. Thus, when the switch K2 switches off, the induced voltage generated on the current storage component L1 will force the one-way semiconductor component D10 to switch on and enables current freewheeling with the charge storage component C3, so as to reduce the current change rate in the current storage component L1 and to suppress the induced voltage across the current storage component L1, to ensure the voltage across the switch K2 is within the safe working range. When the switch K2 switches on again, the energy stored in the charge storage component C3 can be consumed through the damping component R4.

In order to improve the working efficiency of the heating circuit, the energy can be controlled to flow back-and-forth between the battery E and the energy storage circuit, so as to utilize current flow through the damping component R1 in both forward direction and reverse direction to enable heating.

Therefore, in one embodiment of the heating circuit provided in the present invention, the switching control module 100 is configured to control ON/OFF of the switch unit 1, so that the energy flows back-and-forth between the battery E and the energy storage circuit when the switch unit 1 is in ON state.

Figure 9:
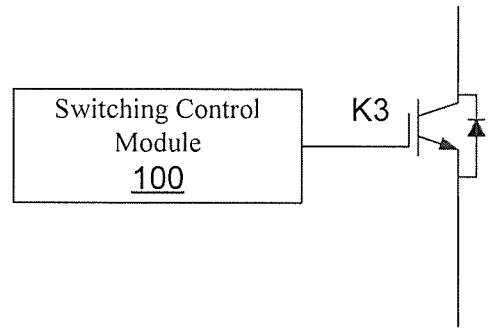
FIG. 9 is a schematic diagram showing the switch unit as part of the battery heating circuit as shown in FIG. 1 according to yet another embodiment of the present invention.

To enable energy flow to-and-fro between the battery E and the energy storage circuit, in one embodiment of the present invention, the switch unit 1 is a two-way switch K3; as shown in FIG. 9, the switching control module 100 controls ON/OFF of the two-way switch K3, i.e., when the battery E needs to be heated, the two-way switch K3 can be controlled to switch on, when heating is to be paused or is not needed, the two-way switch K3 can be controlled to switch off.

Employing a separate two-way switch K3 to implement the switch unit 1 can simplify the circuit, reduce system footprint, and facilitate the implementation; however, to implement cut-off of reverse current, the following embodiment of the switch unit 1 is further provided in the present invention.

Preferably, the switch unit 1 comprises a first one-way branch configured to enable energy flow from the battery E to the energy storage circuit, and a second one-way branch configured to enable energy flow from the energy storage circuit to the battery E; wherein: the switching control module 100 is connected to either or both of the first one-way branch and second one-way branch, to control ON/OFF of the connected branches.

When the battery needs to be heated, both the first one-way branch and the second one-way branch can be controlled to switch on; when heating needs to be paused, either or both of the first one-way branch and the second one-way branch can be controlled to switch off; when heating is not needed, both of the first one-way branch and the second one-way branch can be controlled to switch off. Preferably, both of the first one-way branch and the second one-way branch are subject to the control of the switching control module 100; thus, energy flow cut-off in forward direction and reverse direction can be implemented flexibly.

Figure 10:
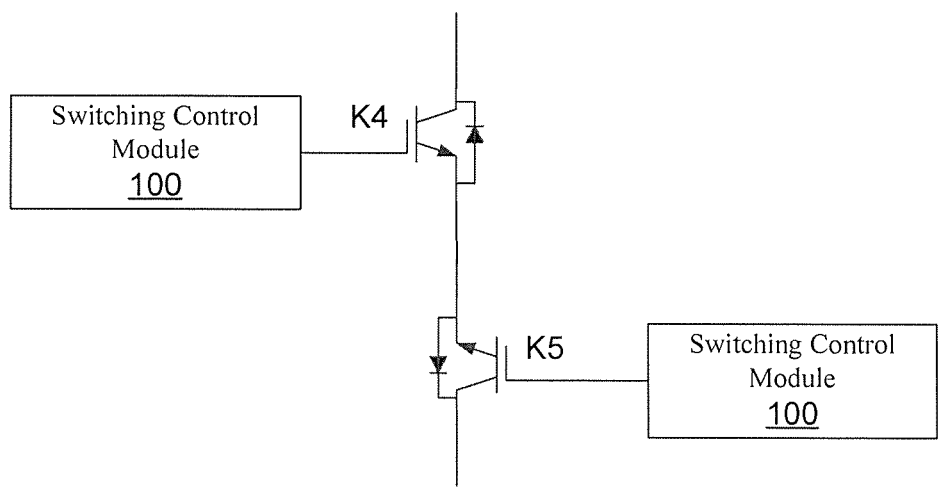
FIG. 10 is a schematic diagram showing the switch unit as part of the battery heating circuit as shown in FIG. 1 according to yet another embodiment of the present invention.

In another embodiment of the switch unit 1, as shown in FIG. 10, the switch unit 1 may comprise a two-way switch K4 and a two-way switch K5, wherein: the two-way switch K4 and the two-way switch K5 are connected in series opposite to each other, to form the first one-way branch and the second one-way branch; the switching control module 100 is connected with the two-way switch K4 and the two-way switch K5 respectively, to control ON/OFF of the first one-way branch and the second one-way branch by controlling ON/OFF of the two-way switch K4 and the two-way switch K5.

When the battery E needs to be heated, the two-way switches K4 and K5 can be controlled to switch on; when heating needs to be paused, either or both of the two-way switch K4 and the two-way switch K5 can be controlled to switch off; when heating is not needed, both of the two-way switch K4 and the two-way switch K5 can be controlled to switch off. In such an implementation of switch unit 1, the first one-way branch and the second one-way branch can be controlled separately to switch on or off, and therefore energy flow cut-off in forward direction and reverse direction in the circuit can be implemented flexibly according to one embodiment.

Figure 11:
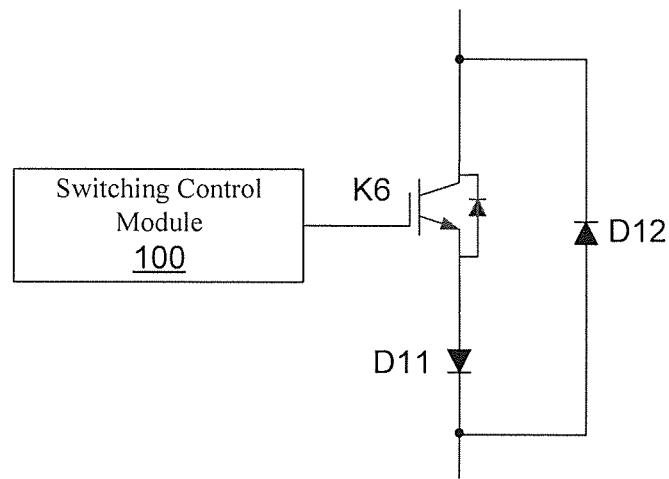
FIG. 11 is a schematic diagram showing the switch unit as part of the battery heating circuit as shown in FIG. 1 according to yet another embodiment of the present invention.

In another embodiment of switch unit 1, as shown in FIG. 11, the switch unit 1 may comprise a switch K6, a one-way semiconductor component D11, and a one-way semiconductor component D12, wherein: the switch K6 and the one-way semiconductor component D11 are connected in series with each other to form the first one-way branch; the one-way semiconductor component D12 forms the second one-way branch; the switching control module 100 is connected with the switch K6, to control ON/OFF of the first one-way branch by controlling ON/OFF of the switch K6. In the switch unit 1 shown in FIG. 11, when heating is needed, the switch K6 can be controlled to switch on; when heating is not needed, the switch K6 can be controlled to switch off.

Figure 12:
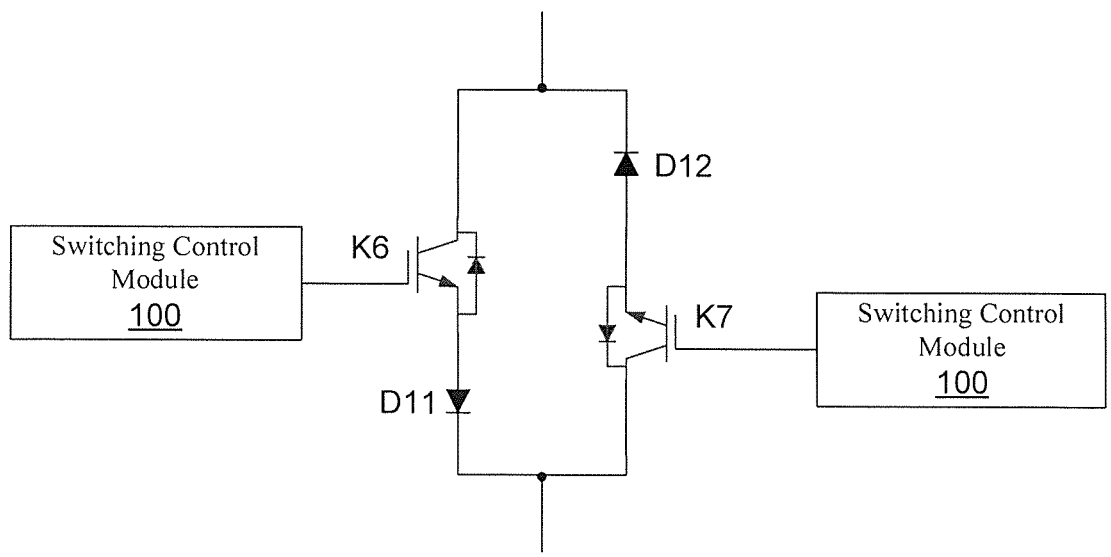
FIG. 12 is a schematic diagram showing the switch unit as part of the battery heating circuit as shown in FIG. 1 according to yet another embodiment of the present invention.

Though the implementation of switch unit 1 shown in FIG. 11 enables to-and-fro energy flow along separate branches, it cannot enable energy flow cut-off function in reverse direction. The present invention further puts forward another embodiment of switch unit 1; as shown in FIG. 12, the switch unit 1 can further comprise a switch K7 in the second one-way branch, wherein: the switch K7 is connected with the one-way semiconductor component D12 in series, the switching control module 100 is also connected with the switch K7, and is configured to control ON/OFF of the second one-way branch by controlling ON/OFF of the switch K7. Thus, in the switch unit 1 shown in FIG. 12, since there are switches (i.e., switch K6 and switch K7) in both one-way branches, energy flow cut-off function in forward direction and reverse direction is enabled simultaneously.

Figure 13:
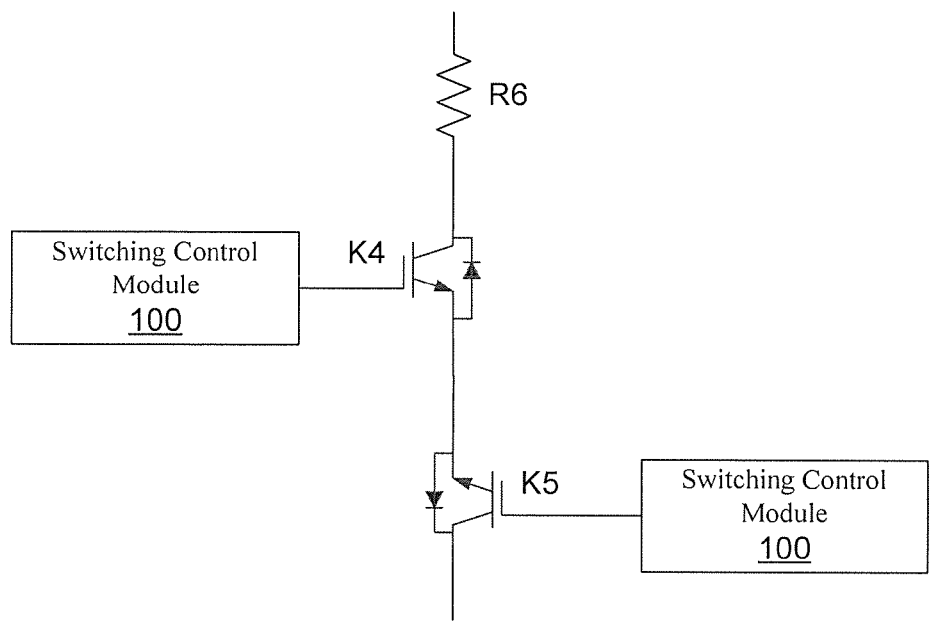
FIG. 13 is a schematic diagram showing the switch unit as part of the battery heating circuit as shown in FIG. 1 according to yet another embodiment of the present invention.
Figure 14:
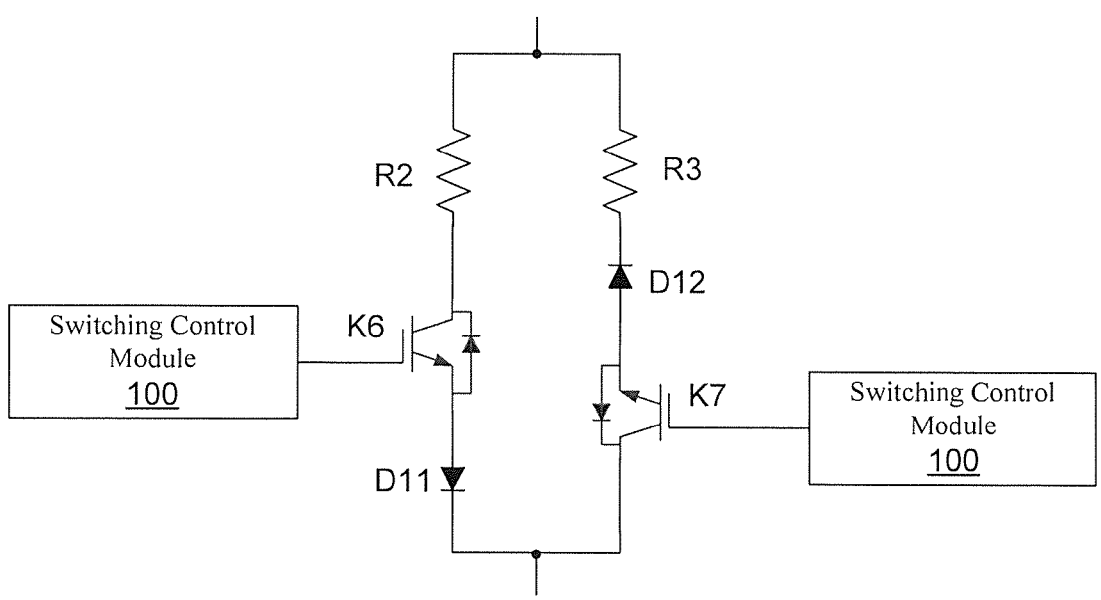
FIG. 14 is a schematic diagram showing the switch unit as part of the battery heating circuit as shown in FIG. 1 according to yet another embodiment of the present invention.

Preferably, the switch unit 1 can further comprise a resistor, which is connected in series with the first one-way branch and/or the second one-way branch and is configured to reduce the current in the heating circuit for the battery E and to avoid damage to the battery E resulted from over-current in the circuit. For example, a resistor R6 connected in series with the two-way switch K4 and the two-way switch K5 can be added in the switch unit 1 shown in FIG. 10, to obtain another implementation of the switch unit 1, as shown in FIG. 13. FIG. 14 also shows one embodiment of the switch unit 1, which is obtained by connecting respectively resistor R2 and resistor R3 in series in both the one-way branches in the switch unit 1 shown in FIG. 12.

In one embodiment in which the energy flows back-and-forth between the battery E and the energy storage circuit, the switch unit 1 can be controlled to switch off at any point of time in one or more cycles, which is to say, the switch unit 1 can switch off at any time, for example, the switch unit 1 can switch off when the current flows through the switch unit 1 in forward direction or reverse direction, and is equal to zero or not equal to zero. A specific implementation form of the switch unit 1 can be selected, depending on the needed cut-off strategy; if current flow cut-off in forward direction is only needed, the implementation form of the switch unit 1 shown in FIG. 9 or FIG. 11 can be selected; if current flow cut-off in both forward direction and reverse direction is needed, the switch unit with two controllable one-way branches shown in FIG. 10 or FIG. 12 can be selected.

Preferably, the switching control module 100 is configured to control the switch unit 1 to switch off when or after the current flow through the switch unit 1 reaches zero after the switch unit 1 switches on. More preferably, the switching control module 100 is configured to control the switch unit 1 to switch off when the current flow through the switch unit 1 reaches zero after the switch unit 1 switches on, so as to minimize the adverse effect to the entire circuit.

In one embodiment of the present invention, the working efficiency of the heating circuit can be improved by superposing the energy in the charge storage component C1 with the energy in the battery E directly, or superposing the remaining energy in the charge storage component C1 with the energy in the battery E after some energy in the charge storage component C1 is consumed.

Figure 15:
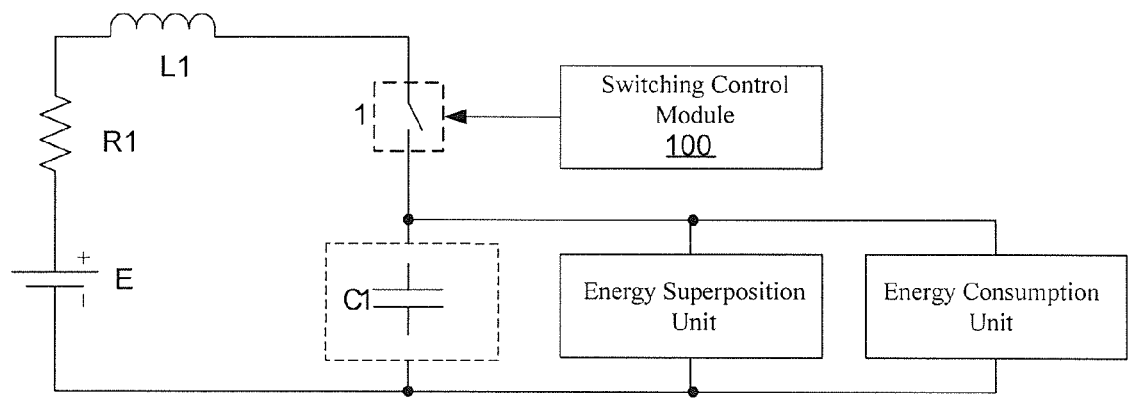
FIG. 15 is a schematic diagram showing a battery heating circuit according to another embodiment of the present invention.

Therefore, as shown in FIG. 15, the heating circuit further comprises an energy consumption unit, which is connected with the charge storage component C1 and is configured to consume the energy in the charge storage component C1 after the switch unit 1 switches on and then switches off and before the energy in the energy superposition unit is superposed. The energy consumption unit can be combined with the embodiments described above, including the embodiments in which the energy flows from the battery E to the energy storage circuit only, and the embodiments in which the energy flows back-and-forth between the battery E and the energy storage circuit.

Figure 16:
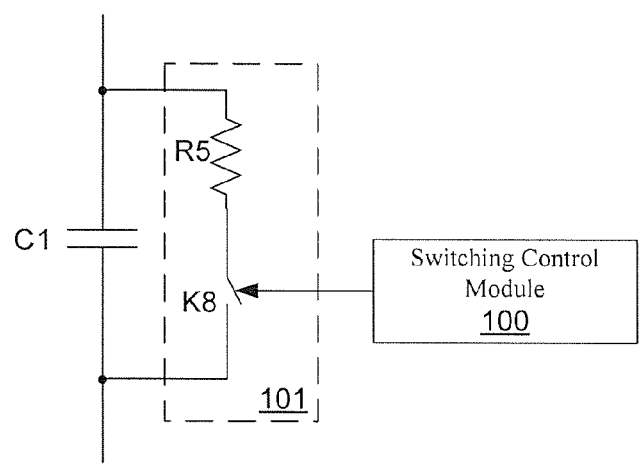
FIG. 16 is a schematic diagram showing the energy consumption unit as part of the battery heating circuit as shown in FIG. 15 according to one embodiment of the present invention.

In one embodiment of the present invention, as shown in FIG. 16, the energy consumption unit comprises a voltage control unit 101, which is configured to convert the voltage across the charge storage component C1 to a predetermined value of voltage after the switch unit 1 switches on and then switches off and before the energy superposition unit performs energy superposition. The preset value of voltage can be set as needed.

In one embodiment of the present invention, as shown in FIG. 16, the voltage control unit 101 comprises a damping component R5 and a switch K8, wherein: the damping component R5 and switch K8 are connected with each other in series, and then connected in parallel across the charge storage component C1; the switching control module 100 is also connected with the switch K8, and is configured to control the switch K8 to switch on after the switch unit 1 switches on and then switches off. Thus, the energy in the charge storage component C1 can be consumed across the damping component R5.

The switching control module 100 can be a separate controller, which, by using internal program setting, enables ON/OFF control of different external switches; or, the switching control module 100 can be a plurality of controllers, for example, a switching control module 100 can be set for each external switch correspondingly; or, the plurality of switching control modules 100 can be integrated into an assembly. The present invention does not impose any limitation on implementation of the switching control module 100 according to some embodiments.

Hereafter the working principle of certain embodiments of the heating circuit for battery E will be described briefly with reference to FIGS. 17-20. It should be noted that though features and components of some embodiments of the present invention are described specifically with reference to FIGS. 17-20, each feature or component may be used separately without other features and components, or may be used in combination or not in combination with other features and components. The embodiments of the heating circuit for battery E provided are not limited to those as shown in FIGS. 17-20. In addition, for example, the grid parts of the waveforms indicate that drive pulses can be applied to the switch one or more times within the period, and the pulse width can be adjusted as needed.

Figure 17:
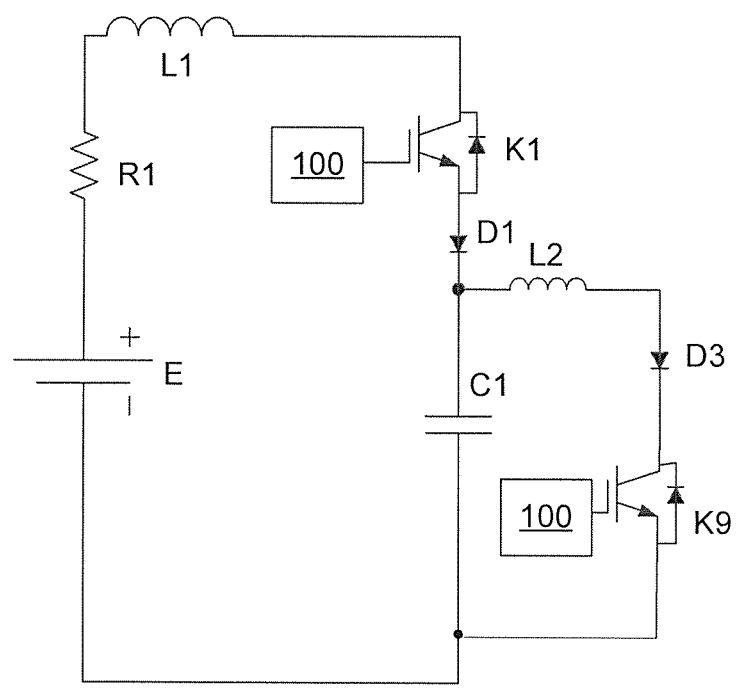
FIG. 17 is a schematic diagram showing a battery heating circuit according to another embodiment of the present invention.
Figure 18:
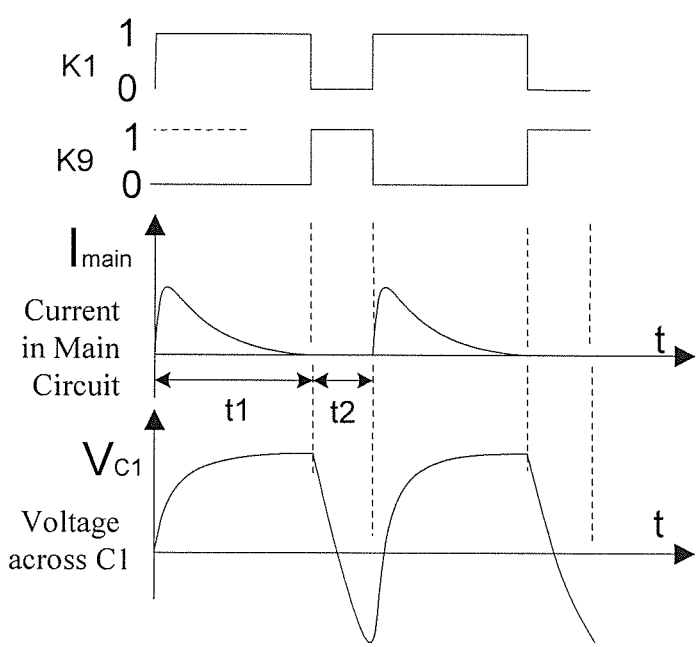
FIG. 18 is a timing diagram of waveforms of the battery heating circuit as shown in FIG. 17 according to one embodiment of the present invention.

For example, in the heating circuit for battery E as shown in FIG. 17, the switch K1 and the one-way semiconductor component D1 constitute the switch unit 1, and the energy storage circuit comprises a current storage component L1 and a charge storage component C1, wherein: the damping component R1 and the switch unit 1 are connected in series with the energy storage circuit; the one-way semiconductor component D3, the current storage component L2, and the switch K9 constitute a polarity inversion unit 102 in the energy superposition unit; the switching control module 100 can control the switch K1 and the switch K9 to switch on and switch off. FIG. 18 is a timing diagram of waveforms corresponding to the heating circuit as shown in FIG. 17, wherein: $V_{C1}$ refers to the voltage value across the charge storage component C1, and $I_{main}$ refers to the value of current flowing through the switch K1 according to some embodiments. In another example, the working process of the heating circuit is as follows:

a) When the battery E is to be heated, the switching control module 100 controls the switch K1 to switch on, and thereby the battery E discharges through the loop composed of the switch K1, the one-way semiconductor component D1, and the charge storage component C1, as indicated by the time duration t1 as shown in FIG. 18; when the current flowing through the switch K1 is zero, the switching control module 100 controls the switch K1 to switch off, as indicated by the time duration t2 as shown in FIG. 18;

b) After the switch K1 switches off, the switching control module 100 controls the switch K9 to switch on, and thereby the charge storage component C1 discharges through the loop composed of the one-way semiconductor component D3, the current storage component L2, and the switch K9, so as to achieve the purpose of voltage polarity inversion, and then, the switching control module 100 controls the switch K9 to switch off, as indicated by the time duration t2 as shown in FIG. 18.

c) Repeat the step a) and the step b), the battery E is heated up continuously while it discharges, till the heating stop condition is met.

Figure 19:
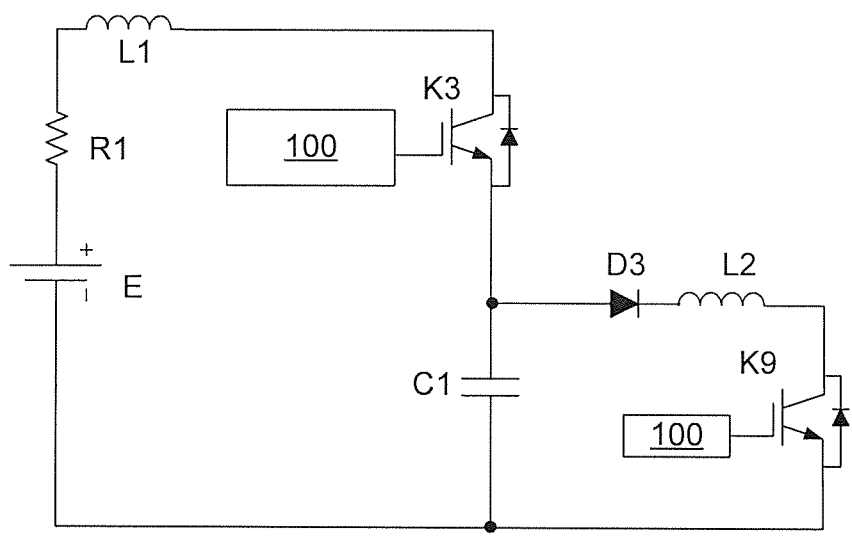
FIG. 19 is a schematic diagram showing a battery heating circuit according to yet another embodiment of the present invention.
Figure 20:
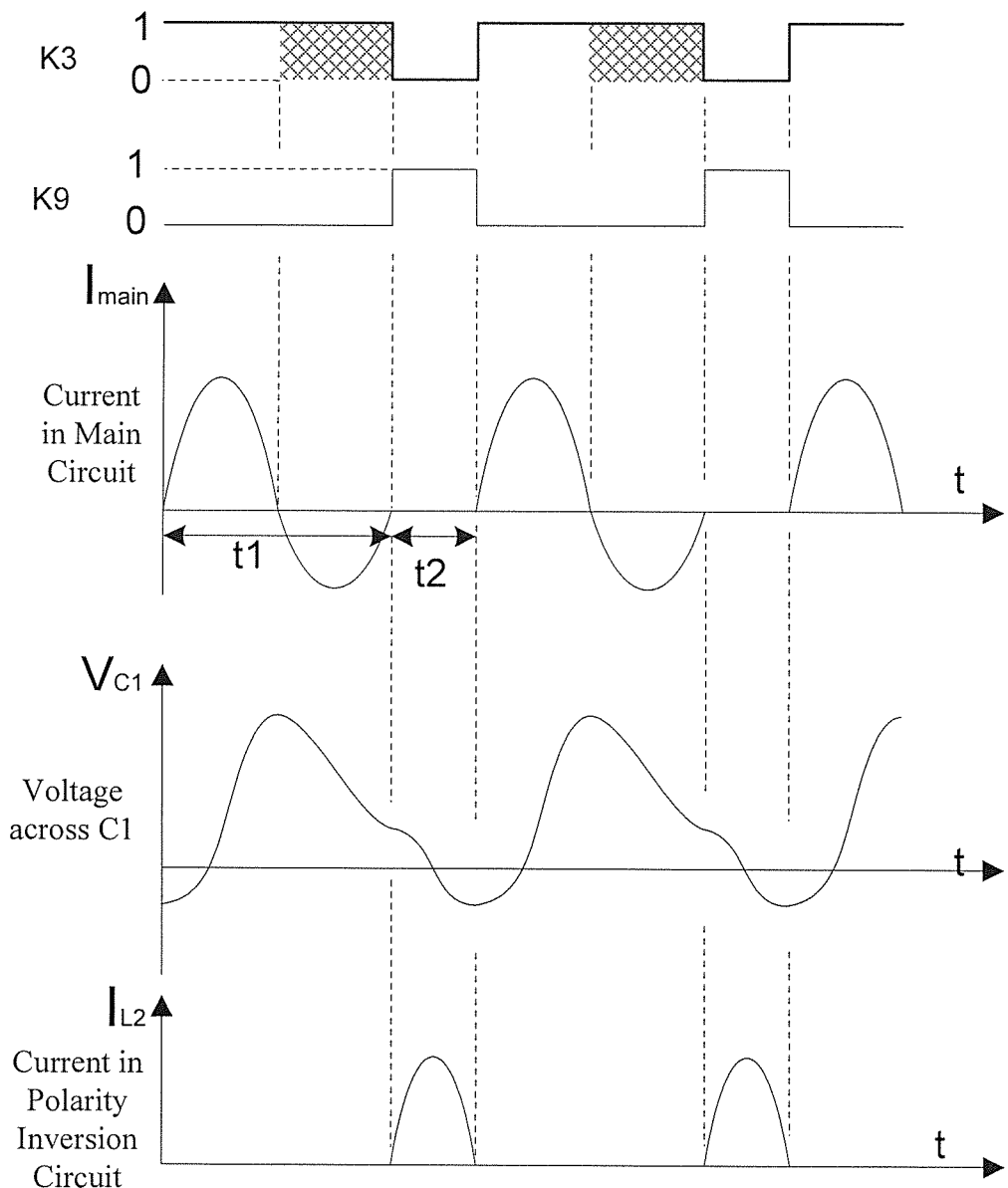
FIG. 20 is a timing diagram of waveforms of the battery heating circuit as shown in FIG. 19 according to one embodiment of the present invention.

For example, in the heating circuit for battery E as shown in FIG. 19, a two-way switch K3 is used to form the switch unit 1; the energy storage circuit comprises a current storage component L1 and a charge storage component C1; the damping component R1 and the switch unit 1 are connected in series with the energy storage circuit; the one-way semiconductor component D3, the current storage component L2, and the switch K9 constitute a polarity inversion unit 102; and the switching control module 100 can control the switch K9 and the two-way switch K3 to switch on and switch off. FIG. 20 is a timing diagram of waveforms corresponding to the heating circuit as shown in FIG. 19, wherein: $V_{C1}$ refers the voltage value across the charge storage component C1, $I_{main}$ refers to the value of current flowing through the two-way switch K3, and $I_{L2}$ refers to the value of current in the polarity inversion loop. In another example, the working process of the heating circuit as shown in FIG. 19 is as follows:

a) The switching control module 100 controls the two-way switch K3 to switch on, and therefore the energy storage circuit starts to operate, as indicated by the time duration t1 as shown in FIG. 20; the battery E discharges in forward direction through the loop composed of the two-way switch K3 and the charge storage component C1 (as indicated by part of the time duration t1 as shown in FIG. 20, i.e., the positive half cycle of the current flowing through the two-way switch K3) and is charged in reverse direction (as indicated by part of the time duration t1 as shown in FIG. 20, i.e., the negative half cycle of the current flowing through the two-way switch K3);

b) The switching control module 100 controls the two-way switch K3 to switch off when the current in reverse direction is zero;

c) The switching control module 100 controls the switch K9 to switch on, and therefore the polarity inversion unit 102 starts to operate; the charge storage component C1 discharges through the loop composed by the semiconductor component D3, the current storage component L2, and the switch K9, to achieve the purpose of voltage polarity inversion; then, the switching control module 100 controls the switch K9 to switch off, as indicated by the time duration t2 as shown in FIG. 20.

d) Repeat the step a) through the step c), the battery E is heated up continuously while it discharges and is charged, till the battery E meets the heating stop condition.

The heating circuit provided in certain embodiments of the present invention can improve the charge/discharge performance of a battery. In addition, for example, since an energy storage circuit is connected with the battery in series in the heating circuit, the safety problem related with short circuit caused by failure of the switch unit can be avoided when the battery is heated due to the existence of the charge storage component connected in series, and therefore the battery can be protected effectively. Moreover, in another example, an energy superposition unit is provided in the heating circuit, and the energy superposition unit can superpose the energy in the energy storage circuit with the energy in the battery after the switch unit switches on and then switches off, thus, the discharging current in the heating loop will be increased when the switch unit is controlled to switch on at the next time, and therefore the working efficiency of the heating circuit is improved.

According to one embodiment, a battery heating circuit comprises a switch unit 1, a switching control module 100, a damping component R1, an energy storage circuit, and an energy superposition unit, wherein: the energy storage circuit is connected with the battery and comprises a current storage component L1 and a charge storage component C1; the damping component R1, the switch unit 1, the current storage component L1, and the charge storage component C1 are connected in series; the switching control module 100 is connected with the switch unit 1 and, configured to control ON/OFF of the switch unit 1, so as to control the energy flowing between the battery and the energy storage circuit; the energy superposition unit is connected with the energy storage circuit and is configured to superpose the energy in the energy storage circuit with the energy in the battery after the switch unit (1) switches on and then switches off.

For example, wherein: the damping component R1 is the parasitic resistance in the battery, and the current storage component L1 is the parasitic inductance in the battery. In another example, wherein: the damping component R1 is a resistor, the current storage component L1 is an inductor, and the charge storage component C1 is a capacitor. In yet another example, wherein: the energy superposition unit comprises a polarity inversion unit 102, which is connected with the energy storage circuit and configured to invert the voltage polarity of the charge storage component C1 after the switch unit 1 switches on and then switches off.

In yet another example, wherein: the polarity inversion unit 102 comprises a single-pole double-throw switch J1 and a single-pole double-throw switch J2 located on the two ends of the charge storage component C1 respectively; the input wire of the single-pole double-throw switch J1 is connected within the energy storage circuit, the first output wire of the single-pole double-throw switch J1 is connected with the first pole plate of the charge storage component C1, and the second output wire of the single-pole double-throw switch J1 is connected with the second pole plate of the charge storage component C1; the input wire of the single-pole double-throw switch J2 is connected within the energy storage circuit, the first output wire of the single-pole double-throw switch J2 is connected with the second pole plate of the charge storage component C1, and the second output wire of the single-pole double-throw switch J2 is connected with the first pole plate of the charge storage component C1; the switching control module 100 is also connected with the single-pole double-throw switch J1 and the single-pole double-throw switch J2 respectively, and is configured to invert the voltage polarity of the charge storage component C1 by altering the connection relationships between the respective input wires and output wires of the single-pole double-throw switch J1 and the single-pole double-throw switch J2. In yet another example, wherein: the polarity inversion unit 102 comprises a one-way semiconductor component D3, a current storage component L2, and a switch K9; the charge storage component C1, the current storage component L2, and the switch K9 are connected sequentially in series to form a loop; the one-way semiconductor component D3 is connected in series between the charge storage component C1 and the current storage component L2 or between the current storage component L2 and the switch K9; the switching control module 100 is also connected with the switch K9 and is configured to invert the voltage polarity of the charge storage component C1 by controlling the switch K9 to switch on. In yet another example, wherein: the polarity inversion unit 102 comprises a first DC-DC module 2 and a charge storage component C2; the first DC-DC module 2 is connected with the charge storage component C1 and the charge storage component C2 respectively; the switching control module 100 is also connected with the first DC-DC module 2, and is configured to transfer the energy in the charge storage component C1 to the charge storage component C2 by controlling the operation of the first DC-DC module 2, and then transfer the energy in the charge storage component C2 back to the charge storage component C1, so as to invert the voltage polarity of the charge storage component C1.

In yet another example, wherein: the switching control module 100 is configured to control ON/OFF of the switch unit 1, so as to control the energy to flow from the battery to the energy storage circuit only. In yet another example, wherein: the switch unit 1 comprises a switch K1 and a one-way semiconductor component D1, the switch K1 and the one-way semiconductor component D1 are connected with each other in series, and then connected within the energy storage circuit in series; the switching control module 100 is connected with the switch K1 and configured to control ON/OFF of the switch unit 1 by controlling ON/OFF of the switch K1. In yet another example, wherein: the switching control module 100 is configured to control the switch unit 1 to switch off when or before the current flow through the switch unit 1 reaches zero after the switch unit 1 switches on. In yet another example, wherein: the switching control module 100 is configured to control the switch unit 1 to switch off before the current flow through the switch unit 1 reaches zero after the switch unit 1 switches on; the switch unit 1 comprises a one-way semiconductor component D9, a one-way semiconductor component D10, a switch K2, a resistor R4, and a charge storage component C3; the one-way semiconductor component D9 and the switch K2 are connected in series within the energy storage circuit, the resistor R4 and the charge storage component C3 are connected with each other in series and then connected across the switch K2 in parallel; the one-way semiconductor component D10 is connected in parallel across the damping component R4 and is configured to sustain the current flow through the current storage component L1 when the switch K2 switches off; the switching control module 100 is connected with the switch K2, and is configured to control ON/OFF of the switch unit 1 by controlling ON/OFF of the switch K2.

In yet another example, wherein: the switching control module 100 is configured to control ON/OFF of the switch unit 1, so that the energy flows back-and-forth between the battery and the energy storage circuit when the switch unit 1 switches on. In yet another example, wherein: the switch unit 1 is a two-way switch K3. In yet another example, wherein: the switch unit 1 comprises a first one-way branch configured to enable energy flow from the battery to the energy storage circuit and a second one-way branch configured to enable energy flow from the energy storage circuit to the battery; the switching control module 100 is connected to either or both of the first one-way branch and the second one-way branch and is configured to control ON/OFF of the switch unit 1 by controlling ON/OFF of the connected branch(es).

In yet another example, wherein: the switch unit 1 comprises a two-way switch K4 and a two-way switch K5, the two-way switch K4 and the two-way switch K5 are connected in series opposite to each other to form the first one-way branch and the second one-way branch; the switching control module 100 is connected with the two-way switch K4 and the two-way switch K5 respectively and is configured to control ON/OFF of the first one-way branch and the second one-way branch by controlling ON/OFF of the two-way switch K4 and the two-way switch K5. In yet another example, wherein: the switch unit 1 comprises a switch K6, a one-way semiconductor component D11, and a one-way semiconductor component D12; the switch K6 and the one-way semiconductor component D11 are connected with each other in series to constitute the first one-way branch; the one-way semiconductor component D12 constitutes the second one-way branch; the switching control module 100 is connected with the switch K6 and is configured to control ON/OFF of the first one-way branch by controlling ON/OFF of the switch K6. In yet another example, wherein: the switch unit 1 further comprises a switch K7 in the second one-way branch, and the switch K7 is connected with the one-way semiconductor component D12 in series; the switching control module 100 is further connected with the switch K7 and is configured to control ON/OFF of the second one-way branch by controlling ON/OFF of the switch K7. In yet another example, wherein: the switch unit (1) further comprises a resistor connected in series with the first one-way branch and/or the second one-way branch.

In yet another example, wherein: the switching control module 100 is configured to control the switch unit 1 to switch off when or after the current flow through the switch unit 1 reaches zero after the switch unit 1 switches on. In yet another example, wherein: the heating circuit further comprises an energy consumption unit, which is connected with the charge storage component C1 and is configured to consume the energy in the charge storage component C1 after the switch unit 1 switches on and then switches off and before the energy superposition unit performs energy superposition. In yet another example, wherein: the energy consumption unit comprises a voltage control unit 101, which is connected with the charge storage component C1, and is configured to convert the voltage value across the charge storage component C1 to a predetermined voltage value after the switch unit 1 switches on and then switches off and before the energy superposition unit performs energy superposition. In yet another example, wherein: the voltage control unit 101 comprises a damping component R5 and a switch K8, the damping component R5 and the switch K8 are connected with each other in series, and then connected in parallel across the charge storage component C1; the switching control module 100 is further connected with the switch K8, and is configured to control the switch K8 to switch on after the control switch unit 1 switches on and then switches off.

According to some embodiments of the present invention, a battery heating circuit comprises a switch unit 1, a switching control module 100, a damping component R1, an energy storage circuit, and an energy superposition unit, wherein: the energy storage circuit is connected with the battery and comprises a current storage component L1 and a charge storage component C1; the damping component R1, the switch unit 1, the current storage component L1, and the charge storage component C1 are connected in series; the switching control module 100 is connected with the switch unit 1, and configured to control ON/OFF of the switch unit 1, so as to control the energy flowing between the battery and the energy storage circuit; the energy superposition unit is connected with the energy storage circuit and is configured to superpose the energy in the energy storage circuit with the energy in the battery after the switch unit 1 switches on and then switches off. For example, the heating circuit provided in the present invention can improve the charge/discharge performance of a battery, enhance the safety of battery heating, and improve the working efficiency of the heating circuit.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits.

While some embodiments of the present invention are described above with reference to the accompanying drawings, the present invention is not limited to the details of those embodiments. Those skilled in the art can make modifications and variations, without departing from the spirit of the present invention. However, all these modifications and variations shall be deemed as falling into the scope of the present invention.

In addition, it should be noted that the specific technical features described in the above embodiments can be combined in any appropriate way, provided that there is no conflict. To avoid unnecessary repetition, certain possible combinations are not described specifically. Moreover, the different embodiments of the present invention can be combined as needed, as long as the combinations do not deviate from the spirit of the present invention. However, such combinations shall also be deemed as falling into the scope of the present invention.

Hence, although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A circuit for heating a battery, the circuit comprising:
the battery including a first damping component and a first current storage component, the first damping component and the first current storage component being parasitic to the battery, the battery including a positive battery terminal and a negative battery terminal;
a switch unit;
a switching control component coupled to the switch unit;
a first charge storage component, the first charge storage component and the first current storage component being at least parts of an energy storage circuit; and
an energy superposition unit connected across the first charge storage component;
wherein:
the first damping component, the first current storage component, the switch unit, and the first charge storage component are connected in a loop;
the switching control component is configured to turn on the switch unit so as to allow a current to flow from the battery to the first charge storage component and to turn off the switch unit so as to stop the current; and
the energy superposition unit is configured to, after the switch unit is turned on and then turned off and while the current is stopped, adjust a storage voltage associated with the first charge storage component so that a positive voltage terminal of the first charge storage component becomes coupled, directly or indirectly, to the negative voltage terminal of the battery;
wherein the circuit for heating the battery is configured to heat the battery by at least discharging the battery.

2. The circuit of claim 1 wherein:
the first damping component is a parasitic resistor of the battery; and
the first current storage component is a parasitic inductor of the battery.

3. The circuit of claim 2 wherein the first charge storage component is a capacitor.

4. The circuit of claim 3 wherein the energy superposition unit includes a polarity inversion unit coupled to the first charge storage component and configured to, after the switch unit is turned on and then turned off, invert a voltage polarity associated with the first charge storage component.

5. The circuit of claim 4 wherein the polarity inversion unit includes:
a first single-pole double-throw switch coupled to a first storage terminal of the first charge storage component; and
a second single-pole double-throw switch coupled to a second storage terminal of the second charge storage component;
wherein:
the first single-pole double-throw switch includes a first input wire, a first output wire, and a second output wire;
the first input wire is coupled, directly or indirectly, to the positive battery terminal; and
the first output wire and the second output wire are coupled to the first storage terminal and the second storage terminal respectively;
wherein:
the second single-pole double-throw switch includes a second input wire, a third output wire, and a fourth output wire;
the second input wire is coupled, directly or indirectly, to the negative battery terminal; and
the third output wire and the fourth output wire are coupled to the second storage terminal and the first storage terminal respectively;
wherein the switching control component is coupled to the first single-pole double-throw switch and the second single-pole double-throw switch, and is configured to invert the voltage polarity associated with the first charge storage component by altering connection relationships among the first input wire, the first output wire, the second output wire, the second input wire, the third output wire, and the fourth output wire.

6. The circuit of claim 4 wherein the polarity inversion unit includes:
a second current storage component;
a second switch; and
a first one-way semiconductor component connected between the first charge storage component and the second current storage component or between the second current storage component and the second switch;

wherein:
the first charge storage component, the first one-way semiconductor component, the current storage component, and the second switch are at least parts of a polarity inversion loop; and
the switching control component is coupled to the second switch and is configured to invert the voltage polarity associated with the first charge storage component by turning on the second switch.

7. The circuit of claim 4 wherein the polarity inversion unit includes:
a second charge storage component; and
a first DC-DC module coupled to the second charge storage component and the first charge storage component;
wherein the switching control component is coupled to the first DC-DC module and configured to invert the voltage polarity associated with the first charge storage component by transferring energy from the first charge storage component to the second charge storage component and then transferring the energy from the second charge storage component back to the first charge storage component.

8. The circuit of claim 1 wherein the switch unit and the switching control component are configured to allow the current to flow from the battery to the first charge storage component if the switch unit is turned on, but never allow the current to flow from the first charge storage component to the battery.

9. The circuit of claim 7 wherein:
the switch unit includes a first switch and a first one-way semiconductor component connected in series with the first switch; and
the switching control component is coupled to the first switch and configured to turn on and off the switch unit by turning on and off the first switch respectively.

10. The circuit of claim 8 wherein the switching control component is configured to, after the switch unit is turned on, turn off the switch unit when or before the current reduces to zero in magnitude.

11. A circuit for heating a battery, the circuit comprising:
the battery including a first damping component and a first current storage component, the first damping component and the first current storage component being parasitic to the battery, the battery including a first battery terminal and a second battery terminal;
a switch unit;
a switching control component coupled to the switch unit;
a first charge storage component, the first charge storage component and the first current storage component being at least parts of an energy storage circuit; and
an energy superposition unit coupled to the first charge storage component;
wherein:
the first damping component, the first current storage component, the switch unit, and the first charge storage component are connected in series;
the switching control component is configured to turn on and off the switch unit so as to control a current flowing between the battery and the first charge storage component; and
the energy superposition unit is configured to, after the switch unit is turned on and then turned off, adjust a storage voltage associated with the first charge storage component so that a positive voltage terminal of the first charge storage component is coupled, directly or indirectly, to a negative voltage terminal of the battery;
wherein the circuit for heating the battery is configured to heat the battery by at least discharging the battery;
wherein the switch unit and the switching control component are configured to allow the current to flow from the battery to the first charge storage component if the switch unit is turned on, but never allow the current to flow from the first charge storage component to the battery;
wherein the switching control component is configured to, after the switch unit is turned on, turn off the switch unit when or before the current reduces to zero in magnitude;
wherein the switch unit includes:
a first one-way semiconductor component;
a second one-way semiconductor component;
a first switch;
a second damping component connected in parallel with the second one-way semiconductor component; and
a second charge storage component connected in series with a combination of the second damping component and the second one-way semiconductor component;
wherein:
the first switch is connected in parallel with a combination of the second damping component, the second one-way semiconductor component, and the second charge storage component; and
the first one-way semiconductor component is connected in series with a combination of the first switch, the second damping component, the second one-way semiconductor component, and the second charge storage component;
wherein the switching control component is coupled to the first switch and configured to turn off the switch unit by turning off the first switch before the current reduces to zero in magnitude.

12. The circuit of claim 1 wherein the switching control component is configured to turn on the switch unit and allow the current to flow from the battery to the first charge storage component and to flow from the first charge storage component to the battery.

13. The circuit of claim 12 wherein the switch unit includes a two-way switch.

14. The circuit of claim 12 wherein the switch unit includes a first branch circuit for conduction in a first direction and a second branch circuit for conduction in a second direction, the first direction being from the battery to the first charge storage component, the second direction being from the first charge storage component to the battery.

15. The circuit of claim 14 wherein the switching control component is coupled to the first branch circuit and configured to turn on and off the first branch circuit.

16. The circuit of claim 15 wherein the switching control component is coupled to the first branch circuit and the second branch circuit and configured to turn on and off the first branch circuit and the second branch circuit respectively.

17. The circuit of claim 15 wherein:
the first branch circuit includes a first switch and a first one-way semiconductor component connected in series with the first switch, the first switch being coupled to the switch control component; and
the second branch circuit includes a second one-way semiconductor component;
wherein the switching control component is further configured to turn on and off the first branch circuit by turning on and off the first switch respectively.

18. The circuit of claim 17 wherein:
the second branch circuit further includes a second switch coupled to the switching control component and connected in series with the second one-way semiconductor component;
wherein the switching control component is further configured to turn on and off the second branch circuit by turning on and off the second switch respectively.

19. The circuit of claim 14 wherein the switch unit further includes a resistor connected in series with at least the first branch circuit or the second branch circuit.

20. The circuit of claim 12 wherein the switch unit includes:
a first two-way switch coupled to the switch control unit; and
a second two-way switch coupled to the switch control unit and connected in series with the first two-way switch;
wherein the switch control unit is further configured to turn on and off the first two-way switch and to turn on and off the second two-way switch.

21. The circuit of claim 1 wherein the switching control component is configured to:
turn on the switch unit to allow the current to flow between the battery and the first charge storage component; and then, turn off the switch unit when or after the current decreases to zero in magnitude.

22. The circuit of claim 1, and further comprising an energy consumption unit coupled to the first charge storage component and configured to consume energy stored in the first charge storage component after the switch unit is turned on and then turned off but before the storage voltage is adjusted by the energy superposition unit.

23. The circuit of claim 22 wherein the energy consumption unit includes a voltage control unit configured to regulate the storage voltage associated with the first charge storage component to a predetermined voltage after the switch unit is turned on and then turned off but before the storage voltage is adjusted by the energy superposition unit.

24. The circuit of claim 23 wherein the voltage control unit includes:
a second damping component; and
a first switch connected in series with the second damping component;
wherein the first charge storage component is connected in parallel with a combination of the second damping component and the first switch.

25. The circuit of claim 1 is further configured to:
start heating the battery if at least one heating start condition is satisfied; and
stop heating the battery if at least one heating stop condition is satisfied.

* * * * *